(12) United States Patent
Watanabe et al.

(10) Patent No.: US 8,329,483 B2
(45) Date of Patent: Dec. 11, 2012

(54) BI-SECTION SEMICONDUCTOR LASER DEVICE, METHOD FOR MANUFACTURING THE SAME, AND METHOD FOR DRIVING THE SAME

(75) Inventors: Hideki Watanabe, Kanagawa (JP); Takao Miyajima, Kanagawa (JP); Masao Ikeda, Kanagawa (JP); Hiroyuki Yokoyama, Miyagi (JP); Tomoyuki Oki, Kanagawa (JP); Masaru Kuramoto, Kanagawa (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 225 days.

(21) Appl. No.: 12/726,524

(22) Filed: Mar. 18, 2010

(65) Prior Publication Data
US 2010/0246622 A1  Sep. 30, 2010

(30) Foreign Application Priority Data

Mar. 26, 2009 (JP) ................................. 2009-077070
Feb. 16, 2010 (JP) ................................. 2010-031299

(51) Int. Cl.
*H01L 21/00* (2006.01)

(52) U.S. Cl. ................ 438/29; 438/35; 438/46; 438/47; 257/79

(58) Field of Classification Search .................... 438/29, 438/35, 46, 47; 257/79–86, 88, 94, 96; 372/43.01, 372/45.013
See application file for complete search history.

(56) References Cited

U.S. PATENT DOCUMENTS
6,653,662 B2  11/2003  Otsuka et al.
2007/0064758 A1*  3/2007  Kuramoto et al. ......... 372/43.01

FOREIGN PATENT DOCUMENTS
JP  2004-007002  1/2004
JP  2004-188678  7/2004
JP  2008-047692  2/2008

* cited by examiner

*Primary Examiner* — Hsien Ming Lee
(74) *Attorney, Agent, or Firm* — SNR Denton US LLP

(57) ABSTRACT

A method for manufacturing a bi-section semiconductor laser device includes the steps of (A) forming a stacked structure obtained by stacking, on a substrate in sequence, a first compound semiconductor layer of a first conductivity type, a compound semiconductor layer that constitutes a light-emitting region and a saturable absorption region, and a second compound semiconductor layer of a second conductivity type; (B) forming a belt-shaped second electrode on the second compound semiconductor layer; (C) forming a ridge structure by etching at least part of the second compound semiconductor layer using the second electrode as an etching mask; and (D) forming a resist layer for forming a separating groove in the second electrode and then forming the separating groove in the second electrode by wet etching so that the separating groove separates the second electrode into a first portion and a second portion.

9 Claims, 18 Drawing Sheets

[STEP-100]

[STEP-110]

[STEP-110] (CONTINUATION)

[STEP-120]

[STEP-130]

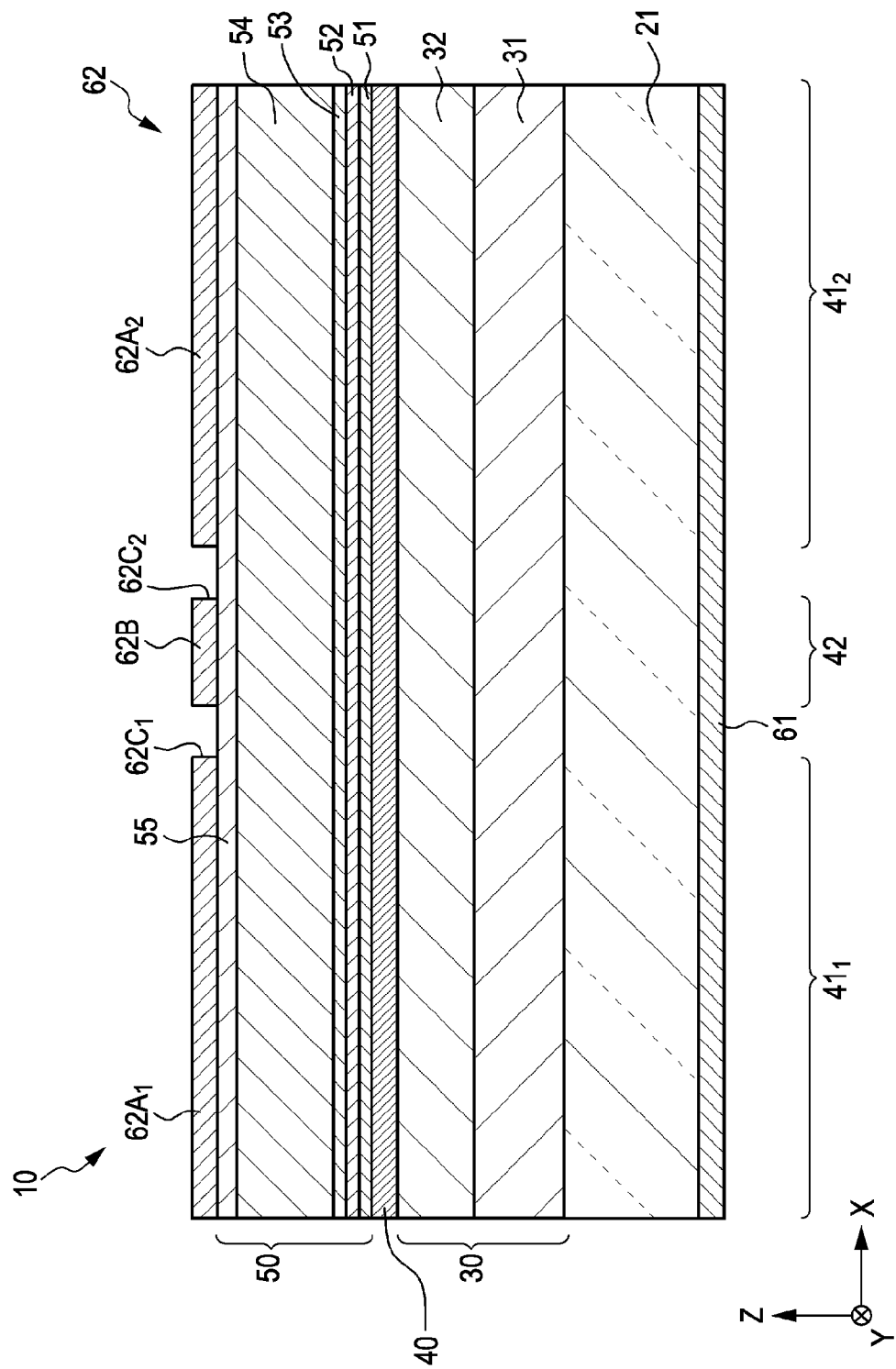

BI-SECTION SEMICONDUCTOR LASER DEVICE, METHOD FOR MANUFACTURING THE SAME, AND METHOD FOR DRIVING THE SAME

BACKGROUND OF THE INVENTION

1. Field of the Invention

The present invention relates to a bi-section semiconductor laser device, a method for manufacturing the same, and a method for driving the same.

2. Description of the Related Art

It is expected that a high-power ultrashort-pulse semiconductor laser device that has an emission wavelength of 405 nm and is composed of a GaN compound semiconductor will realize a light source of a volumetric optical disk system expected to be a next-generation optical disk system of the Blu-ray optical disk system or a light source demanded in medical and bio-imaging fields. There are mainly two methods for generating short-pulsed light in a semiconductor laser device, namely, gain switching and mode locking. Mode locking is further classified into active mode locking and passive mode locking. To generate an optical pulse using active mode locking, an external cavity has to be obtained using a mirror and a lens and radio-frequency (RF) modulation has to be applied to the semiconductor laser device. On the other hand, in passive mode locking, an optical pulse can be generated through simple direct current driving by using self-pulsation (self-oscillation) of a semiconductor laser device.

To operate a semiconductor laser device through self-pulsation, a light-emitting region and a saturable absorption region have to be formed in the semiconductor laser device. Herein, in accordance with the arrangement of the light-emitting region and the saturable absorption region, a semiconductor laser device can be classified into a saturable absorber layer (SAL) type or a weakly index guide (WI) type in which the light-emitting region and the saturable absorption region are arranged in a vertical direction or a bi-section type in which the light-emitting region and the saturable absorption region are arranged side by side in a cavity direction. A bi-section semiconductor laser device is common as disclosed in Japanese Unexamined Patent Application Publication Nos. 2004-007002 (Patent Document 1), 2004-188678 (Patent Document 2), and 2008-047692 (Patent Document 3). A bi-section GaN semiconductor laser device has a large saturable absorption effect and can generate a narrow optical pulse compared with a SAL semiconductor laser device.

In general, a bi-section GaN semiconductor laser device includes:

(a) a stacked structure obtained by stacking, in sequence, a first compound semiconductor layer of a first conductivity type composed of a GaN compound semiconductor, a compound semiconductor layer that constitutes a light-emitting region and a saturable absorption region each composed of a GaN compound semiconductor, and a second compound semiconductor layer of a second conductivity type different from the first conductivity type composed of a GaN compound semiconductor;

(b) a belt-shaped second electrode formed on the second compound semiconductor layer; and (c) a first electrode electrically connected to the first compound semiconductor layer.

The second electrode is separated by a separating groove into a first portion configured to provide a forward bias state by supplying a DC current to the first electrode through the light-emitting region and a second portion configured to apply an electric field from the first electrode through the saturable absorption region.

SUMMARY OF THE INVENTION

In the method for manufacturing a bi-section semiconductor laser device disclosed in Patent Document 1, after a stacked structure is formed, a first metal film is formed on a second compound semiconductor layer. Subsequently, a second electrode is separated by a separating groove into a first portion and a second portion through dry etching of the first metal film. An etching mask is then formed, and a ridge structure is formed. In the method for manufacturing a bi-section semiconductor laser device disclosed in Patent Document 1, a ridge structure is not formed through self-alignment using the patterned second electrode as an etching mask. Therefore, misalignment is easily caused between the second electrode and the ridge structure. Furthermore, an oxidation film and impurities are easily left between the second compound semiconductor layer and the first metal film, which easily poses a problem in that the operating voltage of the laser device is increased as the contact resistance of the compound semiconductor layer and the metal film is increased.

In the method for manufacturing a bi-section semiconductor laser device disclosed in Patent Document 2, after a stacked structure is formed, an etching mask is formed and a ridge structure is formed. Subsequently, an insulating layer is formed on the side of the ridge structure, and a second electrode separated by a separating groove into a first portion and a second portion is formed by performing liftoff across the upper surface of the insulating layer and a second compound semiconductor layer. Therefore, in the method for manufacturing a bi-section semiconductor laser device disclosed in Patent Document 2, an oxidation film and impurities are also easily left between the second compound semiconductor layer and the first metal film, which easily poses a problem in that the operating voltage of the laser device is increased as the contact resistance of the compound semiconductor layer and the metal film is increased.

In the method for manufacturing a bi-section semiconductor laser device disclosed in Patent Document 3, after a stacked structure is formed, an etching mask is formed and a ridge structure is formed. Subsequently, an n-type buffer layer, a p-side contact layer, an etching stop layer, and a cap layer are formed, and the entire surface is polished until the p-side contact layer is exposed. A second electrode separated by a separating groove into a first portion and a second portion is then formed by performing liftoff on the exposed p-side contact layer. In the method for manufacturing a bi-section semiconductor laser device disclosed in Patent Document 3, the steps until the second electrode is formed are complicated and there are problems such as degradation in the electrical and optical characteristics of the surface of the p-side contact layer due to polishing, an increase in the operating voltage of the laser device caused by an increase in the contact resistance, and an increase in a threshold current and a decrease in a slope efficiency due to an increase in optical loss.

It is reported in many papers that bi-section semiconductor laser devices operate through self-pulsation by independently driving the light-emitting region at a forward bias and the saturable absorption region at a zero bias. However, as far as the inventors of the present invention know, there are no confirmed cases where a bi-section GaN semiconductor laser device actually operates through self-pulsation when the light-emitting region is driven at a forward bias and the saturable absorption region is driven at a reverse bias independently.

It is desirable to provide a method for manufacturing a bi-section semiconductor laser device that allows a ridge structure and a second electrode separated by a separating groove into a first portion and a second portion to be formed accurately, with certainty, and easily. It is also desirable to provide a bi-section semiconductor laser device that operates through self-pulsation with certainty when a light-emitting region is driven at a forward bias and a saturable absorption region is driven at a reverse bias independently and to provide a method for driving the bi-section semiconductor laser device.

According to an embodiment of the present invention, there is provided a method for manufacturing a bi-section semiconductor laser device, including the steps of:

(A) forming a stacked structure obtained by stacking, on a substrate in sequence, a first compound semiconductor layer of a first conductivity type composed of a GaN compound semiconductor, a compound semiconductor layer that constitutes a light-emitting region and a saturable absorption region each composed of a GaN compound semiconductor, and a second compound semiconductor layer of a second conductivity type different from the first conductivity type composed of a GaN compound semiconductor;

(B) forming a belt-shaped second electrode on the second compound semiconductor layer;

(C) forming a ridge structure by etching at least part of the second compound semiconductor layer using the second electrode as an etching mask; and (D) forming a resist layer for forming a separating groove in the second electrode and then forming the separating groove in the second electrode by wet etching using the resist layer as a wet-etching mask so that the separating groove separates the second electrode into a first portion and a second portion.

In the step (c), part of the second compound semiconductor layer may be etched in the thickness direction or the entire second compound semiconductor layer may be etched in the thickness direction. Alternatively, the second compound semiconductor layer and the compound semiconductor layer constituting the light-emitting region and the saturable absorption region may be etched in the thickness direction or the second compound semiconductor layer, the compound semiconductor layer constituting the light-emitting region and the saturable absorption region, and part of the first compound semiconductor layer may be etched in the thickness direction.

According to first and second embodiments of the present invention, there is provided a bi-section semiconductor laser device including:

(a) a stacked structure obtained by stacking, in sequence, a first compound semiconductor layer of a first conductivity type composed of a GaN compound semiconductor, a compound semiconductor layer that constitutes a light-emitting region and a saturable absorption region each composed of a GaN compound semiconductor, and a second compound semiconductor layer of a second conductivity type different from the first conductivity type composed of a GaN compound semiconductor;

(b) a belt-shaped second electrode formed on the second compound semiconductor layer; and (c) a first electrode electrically connected to the first compound semiconductor layer, wherein the second electrode is separated by a separating groove into a first portion configured to provide a forward bias state by supplying a direct current to the first electrode through the light-emitting region and a second portion configured to apply an electric field to the saturable absorption region.

In the bi-section semiconductor laser device according to a first embodiment of the present invention, the electrical resistance between the first portion and the second portion of the second electrode is $1 \times 10$ times or more, preferably $1 \times 10^2$ times or more, more preferably $1 \times 10^3$ times or more the electrical resistance between the second electrode and the first electrode. In the bi-section semiconductor laser device according to a second embodiment of the present invention, an electrical resistance between the first portion and the second portion of the second electrode is $1 \times 10^2 \Omega$ or more, preferably $1 \times 10^3 \Omega$ or more, more preferably $1 \times 10^4 \Omega$ or more.

According to first and second embodiments of the present invention, there is provided a bi-section semiconductor laser device used in the method for diving a bi-section semiconductor laser device, the bi-section semiconductor laser device including:

(a) a stacked structure obtained by stacking, in sequence, a first compound semiconductor layer of a first conductivity type composed of a GaN compound semiconductor, a compound semiconductor layer that constitutes a light-emitting region and a saturable absorption region each composed of a GaN compound semiconductor, and a second compound semiconductor layer of a second conductivity type different from the first conductivity type composed of a GaN compound semiconductor;

(b) a belt-shaped second electrode formed on the second compound semiconductor layer; and (c) a first electrode electrically connected to the first compound semiconductor layer, wherein the second electrode is separated by a separating groove into a first portion and a second portion.

In the method for driving a bi-section semiconductor laser device according to the first embodiment of the present invention, the electrical resistance between the first portion and the second portion of the second electrode is 10 times or more, preferably $1 \times 10^2$ times or more, more preferably $1 \times 10^3$ times or more the electrical resistance between the second electrode and the first electrode; and the method includes the steps of providing a forward bias state by supplying a direct current from the first portion of the second electrode to the first electrode through the light-emitting region, and applying an electric field to the saturable absorption region by applying a voltage between the first electrode and the second portion of the second electrode to operate the bi-section semiconductor laser device through self-pulsation.

In the method for driving a bi-section semiconductor laser device according to the second embodiment of the present invention, the electrical resistance between the first portion and the second portion of the second electrode is $1 \times 10^2 \Omega$ or more, preferably $1 \times 10^3 \Omega$ or more, more preferably $1 \times 10^4 \Omega$ or more; and the method includes the steps of providing a forward bias state by supplying a direct current from the first portion of the second electrode to the first electrode through the light-emitting region, and applying an electric field to the saturable absorption region by applying a voltage between the first electrode and the second portion of the second electrode to operate the bi-section semiconductor laser device through self-pulsation.

In the method for manufacturing a bi-section semiconductor laser device according to an embodiment of the present invention, a ridge structure is formed by etching at least part of the second compound semiconductor layer using the belt-shaped second electrode as an etching mask. Since the ridge structure is formed through self-alignment using the patterned second electrode as an etching mask, misalignment is not caused between the second electrode and the ridge structure. In addition, a separating groove is formed in the second electrode by wet etching. By adopting wet etching but not dry etching, the degradation of the optical and electrical characteristics of the second compound semiconductor layer can be suppressed. Therefore, the light-emitting characteristics of the bi-section semiconductor laser device can be prevented from being degraded with certainty.

In the bi-section semiconductor laser device according to an embodiment of the present invention or in the bi-section semiconductor laser device used in the method for driving a bi-section semiconductor laser device according to an embodiment of the present invention, the electrical resistance between the first portion and the second portion of the second electrode is 10 times or more that between the second electrode and the first electrode or $1 \times 10^2 \Omega$ or more. Thus, a leakage current flowing from the first portion of the second electrode to the second portion can be suppressed with certainty. In other words, a reverse bias voltage applied to the saturable absorption region can be increased while at the same time a current injected into the light-emitting region (gain region) can be increased. This can achieve a self-pulsation operation in a single mode that has an optical pulse with high peak power. Furthermore, such a high electrical resistance between the first portion and the second portion of the second electrode can be achieved by only separating the second electrode into the first portion and the second portion by the separating groove. In other words, the optical pulse generation using mode locking can be easily achieved, which can provide a short pulse GaN semiconductor laser device, a light source of a volumetric optical disk system using the same, and a light source demanded in medical and bio-imaging fields.

BRIEF DESCRIPTION OF THE DRAWINGS

FIG. 18 is a schematic end view in another modification of the bi-section semiconductor laser device of Example 1 in a direction in which the cavity of the bi-section semiconductor laser device extends.

DESCRIPTION OF THE PREFERRED EMBODIMENTS

Figure 1:
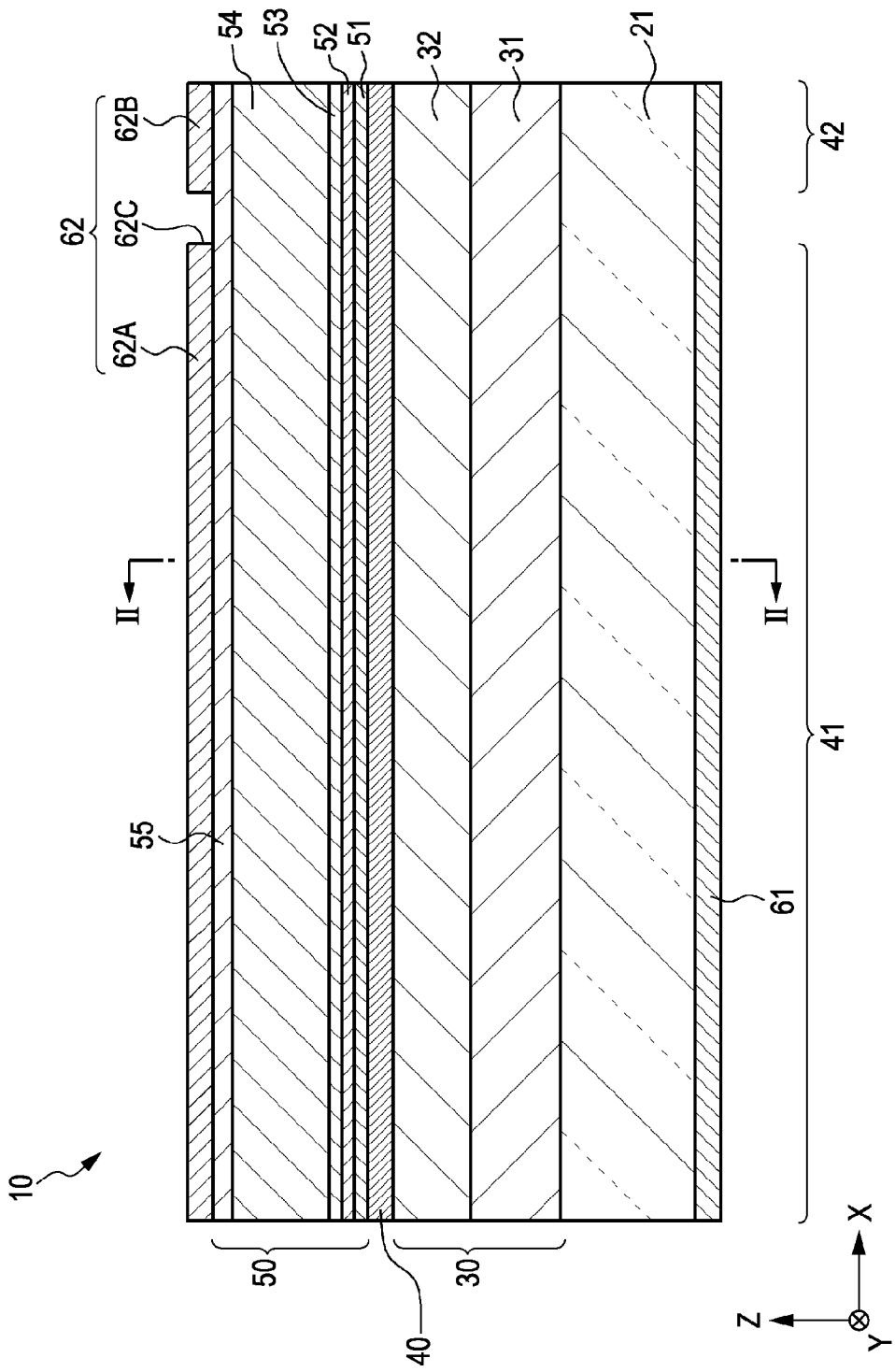
FIG. 1 is a schematic end view of a bi-section semiconductor laser device of Example 1 in a direction in which the cavity of the bi-section semiconductor laser device extends.

The present invention will now be described on the basis of Examples with reference to the attached drawings, but is not limited to Examples. Various values and materials described in Examples are mere examples. The description is performed in the following order.
1. Method for Manufacturing Bi-section Semiconductor Laser Device According to Embodiment of the Present Invention, Bi-section Semiconductor Laser Devices According to First and Second Embodiments of the Present Invention and Method for Driving the Devices, and General Description
2. Example 1 (Method for Manufacturing Bi-section Semiconductor Laser Device According to Embodiment of the Present Invention, Bi-section Semiconductor Laser Devices According to First and Second Embodiments of the Present Invention and Method for Driving the Devices)
3. Example 2 (Modification of Example 1) and Others Method for Manufacturing Bi-Section Semiconductor Laser Device According to Embodiment of the Present Invention, Bi-Section Semiconductor Laser Devices According to First and Second Embodiments of the Present Invention and Method for Driving the Devices, and General Description In the method for manufacturing a bi-section semiconductor laser device according to an embodiment of the present invention, in the step (D), assuming that the etching rate of the second electrode is $ER_0$ and the etching rate of the stacked structure is $ER_1$ when the separating groove is formed in the second electrode, $ER_0/ER_1 \geq 1 \times 10$ is satisfied and $ER_0/ER_1 \geq 1 \times 10^2$ is preferably satisfied. When $ER_0$ and $ER_1$ satisfy such a relationship, the second electrode can be etched with certainty while the stacked structure is not etched (or is slightly etched).

In this case, the second electrode is preferably composed of a palladium (Pd) single layer, a nickel (Ni) single layer, a platinum (Pt) single layer, or a laminated structure having a lower metal layer and an upper metal layer, the lower metal layer being in contact with the second compound semiconductor layer (where the lower metal layer is composed of a single metal selected from palladium, nickel, and platinum; and the upper metal layer is composed of a metal whose etching rate when the separating groove is formed in the second electrode in the step (D) is equal to, substantially equal to, or higher than the etching rate of the lower metal layer). When the lower metal layer is composed of palladium and the upper metal layer is composed of nickel, the thickness of the upper metal layer is 0.1 μm or more, preferably 0.2 μm or more. Alternatively, the second electrode is preferably composed of a palladium (Pd) single layer. In this case, the thickness of the second electrode is 20 nm or more, preferably 50 nm or more. The etching solution used when the separating groove is formed in the second electrode in the step (D) is preferably aqua regia, nitric acid, sulfuric acid, hydrochloric acid, or a mixed solution of at least two selected therefrom (specifically, a mixed solution of nitric acid and sulfuric acid or a mixed solution of sulfuric acid and hydrochloric acid).

In the method for manufacturing a bi-section semiconductor laser device according to an embodiment of the present invention, the method including the preferred structures and configurations described above, the bi-section semiconductor laser device includes a first electrode electrically connected to the first compound semiconductor layer, and the electrical resistance between the first portion and the second portion of the second electrode is $1 \times 10$ times or more, preferably $1 \times 10^2$ times or more, more preferably $1 \times 10^3$ times or more the electrical resistance between the second electrode and the first electrode. Alternatively, the electrical resistance between the first portion and the second portion of the second electrode is $1 \times 10^2 \Omega$ or more, preferably $1 \times 10^3 \Omega$ or more, more preferably $1 \times 10^4 \Omega$ or more.

In the method for manufacturing a bi-section semiconductor laser device according to an embodiment of the present invention, the bi-section semiconductor laser devices according to the first and second embodiments of the present invention, or the method for driving the semiconductor laser devices, all of which including the preferred structures and configurations described above, the second electrode has a width of 0.5 μm or more and 50 μm or less, preferably 1 μm or more and 5 μm or less; the ridge structure has a height of 0.1 μm or more and 10 μm or less, preferably 0.2 μm or more and 1 μm or less; and the width of the separating groove that separates the second electrode into the first portion and the second portion is 1 μm or more and 50% or less of cavity length, preferably 10 μm or more and 10% or less of cavity length. Although 0.3 mm can be exemplified as the cavity length, the cavity length is not limited to 0.3 mm.

In the bi-section semiconductor laser devices according to the first and second embodiments of the present invention or the method for driving the semiconductor laser devices, both of which including the preferred structures and configurations described above, the second electrode can be composed of a palladium (Pd) single layer, a nickel (Ni) single layer, a platinum (Pt) single layer, a laminated structure of palladium layer/platinum layer, the palladium layer being in contact with the second compound semiconductor layer; or a laminated structure of palladium layer/nickel layer, the palladium layer being in contact with the second compound semiconductor layer. When the lower metal layer is composed of palladium and the upper metal layer is composed of nickel, the thickness of the upper metal layer is 0.1 μm or more, preferably 0.2 μm or more. Alternatively, the second electrode is preferably composed of a palladium (Pd) single layer. In this case, the thickness of the second electrode is 20 nm or more, preferably 50 nm or more.

In the method for manufacturing a bi-section semiconductor laser device according to an embodiment of the present invention, the bi-section semiconductor laser devices according to the first and second embodiments of the present invention, or the method for driving the semiconductor laser devices, all of which including the preferred structures and configurations described above (hereinafter may be collectively referred to as "the present invention"), the first portion and the second portion of the second electrode are arranged as follows:

(1) a single first portion of the second electrode and a single second portion of the second electrode are formed, and the first portion and the second portion of the second electrode are arranged so as to sandwich a separating groove;

(2) a single first portion of the second electrode and two second portions of the second electrode are formed, and the first portion has one end that faces one second portion through one separating groove and the other end that faces the other second portion through the other separating groove; and (3) two first portions of the second electrode and a single second portion of the second electrode are formed, and the second portion has one end that faces one first portion through one separating groove and the other end that faces the other first portion through the other separating groove.

In the present invention, the semiconductor laser device can be a semiconductor laser device having a ridge stripe-type separate confinement heterostructure (SCH structure).

In the present invention including the preferred structures and configurations described above, the stacked structure can be composed of, for example, an AlGaInN compound semiconductor. Examples of the AlGaInN compound semiconductor include GaN, AlGaN, GaInN, and AlGaInN. Furthermore, boron (B) atoms, thallium (Tl) atoms, arsenic (As) atoms, phosphorus (P) atoms, or antimony (Sb) atoms may be optionally added to the compound semiconductor. The compound semiconductor layer (may be referred to as an "active layer") constituting the light-emitting region (gain region) and the saturable absorption region preferably has a quantum well structure. Specifically, the compound semiconductor layer may have a single quantum well structure (QW structure) or a multiple quantum well structure (MQW structure). An active layer having a quantum well structure has a structure in which at least one well layer and barrier layer are stacked. Examples of the combination of a compound semiconductor constituting the well layer and a compound semiconductor constituting the barrier layer include ($In_yGa_{(1-y)}N$, GaN), ($In_yGa_{(1-y)}N$, $In_zGa_{(1-z)}N$) (where y>z), and ($In_yGa_{(1-y)}N$, AlGaN).

In the present invention including the preferred structures and configurations described above, the second compound semiconductor layer can have a superlattice structure in which p-type GaN layers and p-type AlGaN layers are alternately stacked, the thickness of the superlattice structure being 0.7 µm or less. By adopting such a superlattice structure, the series resistance of the semiconductor laser device can be decreased while a high refractive index necessary as a cladding layer is maintained, which reduces the operating voltage of the semiconductor laser device. The lower limit of the thickness of the superlattice structure is, for example, 0.3 µm, but is not limited thereto. The p-type GaN layers and the p-type AlGaN layers constituting the superlattice structure can each have a thickness of 1 to 5 nm. The total number of the p-type GaN layers and the p-type AlGaN layers is, for example, 60 to 300. The distance from the active layer to the second electrode can be 1 µm or less, preferably 0.6 µm or less. By providing the distance from the active layer to the second electrode, the p-type second compound semiconductor layer having a high resistance can be thinned and thus the operating voltage of the semiconductor laser device can be reduced. The lower limit of the distance from the active layer to the second electrode is, for example, 0.3 µm, but is not limited thereto. The second compound semiconductor layer is doped with $1\times10^{19}$ $cm^{-3}$ or more of Mg. The absorption coefficient of the second compound semiconductor layer with respect to light with a wavelength of 405 nm emitted from the active layer is at least 50 $cm^{-1}$. The atomic concentration of Mg is set on the basis of the physical properties of a material that exhibit the maximum hole concentration at an atomic concentration of $2\times10^{19}$ $cm^{-3}$. The atomic concentration of Mg has been determined such that the hole concentration is maximized, that is, the resistivity of the second compound semiconductor layer is minimized. The absorption coefficient of the second compound semiconductor layer is provided such that the resistance of the semiconductor laser device is decreased as much as possible. As a result, the absorption coefficient of light emitted from the active layer generally becomes 50 $cm^{-1}$. However, the doping amount of Mg can be intentionally set to a concentration of $2\times10^{19}$ $cm^{-3}$ or higher to increase the absorption coefficient. In this case, the upper limit of the doping amount of Mg to achieve a practical hole concentration is, for example, $8\times10^{19}$ $cm^{-3}$. The second compound semiconductor layer includes non-doped compound semiconductor layers and p-type compound semiconductor layers in that order from the active layer side, and the distance from the active layer to the p-type compound semiconductor layers can be $1.2\times10^{-7}$ m or less. By providing the distance from the active layer to the p-type compound semiconductor layers, internal loss can be suppressed without decreasing an internal quantum efficiency, which can reduce the threshold current density at which laser oscillation is started. The lower limit of the distance from the active layer to the p-type compound semiconductor layers is, for example, $5\times10^{-8}$ m, but is not limited to this. Stacked insulating films having a $SiO_2/Si$ laminated structure are formed on both side faces of a ridge portion, and the difference in an effective refractive index between the ridge portion and the stacked insulating film can be $5\times10^{-3}$ to $1\times10^{-2}$. With such a stacked insulating film, a single fundamental transverse mode can be maintained even in a high-power operation with over 100 mW. The second compound semiconductor layer can have a structure obtained by stacking, for example, a non-doped GaInN layer (p-side light guide layer), a non-doped AlGaN layer (p-side cladding layer), a Mg-doped AlGaN layer (electron barrier layer), a superlattice structure (superlattice cladding layer) of GaN layer (Mg-doped)/AlGaN layer, and a Mg-doped GaN layer (p-side contact layer) in that order from the active layer side. The band gap of the compound semiconductor constituting the well layer in the active layer is 2.4 eV or higher. The wavelength of laser beams emitted from the active layer is 360 to 500 nm, preferably 400 to 410 nm. Obviously, the various structures described above can be suitably combined with each other.

In the present invention, various GaN compound semiconductor layers constituting the semiconductor laser device are formed on a substrate in sequence. In addition to a sapphire substrate, examples of the substrate include a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and one of these substrates whose surface (principal surface) has a base layer or a buffer layer. Furthermore, examples of the method for forming the various GaN compound semiconductor layers constituting the semiconductor laser device include metal-organic chemical vapor deposition (MOCVD), metal-organic vapor-phase epitaxy (MOVPE), molecular beam epitaxy (MBE), and hydride vapor deposition in which halogens contribute to transport or reaction.

Trimethylgallium (TMG) gas and triethylgallium (TEG) gas can be exemplified as an organic gallium source gas of the MOCVD. Ammonia gas and hydrazine gas can be exemplified as a nitrogen source gas. To form an n-type GaN compound semiconductor layer, for example, silicon (Si) is added as an n-type impurity (n-type dopant). To form a p-type GaN compound semiconductor layer, for example, magnesium (Mg) is added as a p-type impurity (p-type dopant). When aluminum (Al) or indium (In) is included as a constituent atom of the GaN compound semiconductor layer, trimethylaluminum (TMA) gas is used as an Al source and trimethylindium (TMI) gas is used as an In source. In addition, monosilane ($SiH_4$) gas is used as a Si source, and cyclopentadienylmagnesium gas, methylcyclopentadienylmagnesium, or bis(cyclopentadienyl)magnesium ($Cp_2Mg$) is used as a Mg source. In addition to Si, examples of the n-type impurity (n-type dopant) include Ge, Se, Sn, C, Te, S, O, Pd, and Po. In addition to Mg, examples of the p-type impurity (p-type dopant) include Zn, Cd, Be, Ca, Ba, C, Hg, and Sr.

When the first conductivity type is an n-type, the first electrode electrically connected to the n-type first compound semiconductor layer preferably has a single-layer structure or a multi-layer structure including at least one metal selected from gold (Au), silver (Ag), palladium (Pd), aluminum (Al), titanium (Ti), tungsten (W), copper (Cu), zinc (Zn), tin (Sn), and indium (In). Examples of such a multi-layer structure include Ti/Au, Ti/Al, and Ti/Pt/Au. The first electrode is electrically connected to the first compound semiconductor layer, which includes configurations in which the first electrode is formed on the first compound semiconductor layer and in which the first electrode is connected to the first compound semiconductor layer through a conductive material layer or a conductive substrate. The first electrode and the second electrode can be formed by physical vapor deposition such as vacuum deposition or sputtering.

A pad electrode may be formed on the first electrode and the second electrode such that the first electrode and the second electrode are electrically connected to an external electrode or circuit. The pad electrode preferably has a single-layer structure or a multi-layer structure including at least one metal selected from titanium (Ti), aluminum (Al), platinum (Pt), gold (Au), and nickel (Ni). Alternatively, the pad electrode can have a multi-layer structure such as Ti/Pt/Au or Ti/Au.

The present invention can be applied to, for example, an optical disk system, a communication field, an optical information field, a photoelectron integrated circuit, a field to which nonlinear optical phenomena are applied, an optical switch, a laser measurement field and various analysis fields, a field of ultra-high speed spectroscopy, a field of multiphoton excitation spectroscopy, a field of mass spectrometry, a field of microspectroscopy using multiphoton absorption, quantum manipulation of chemical reaction, a field of three-dimensional nano-machining, various processing fields that use multiphoton absorption, a medical field, and a bio-imaging field.

EXAMPLE 1

Figure 2:
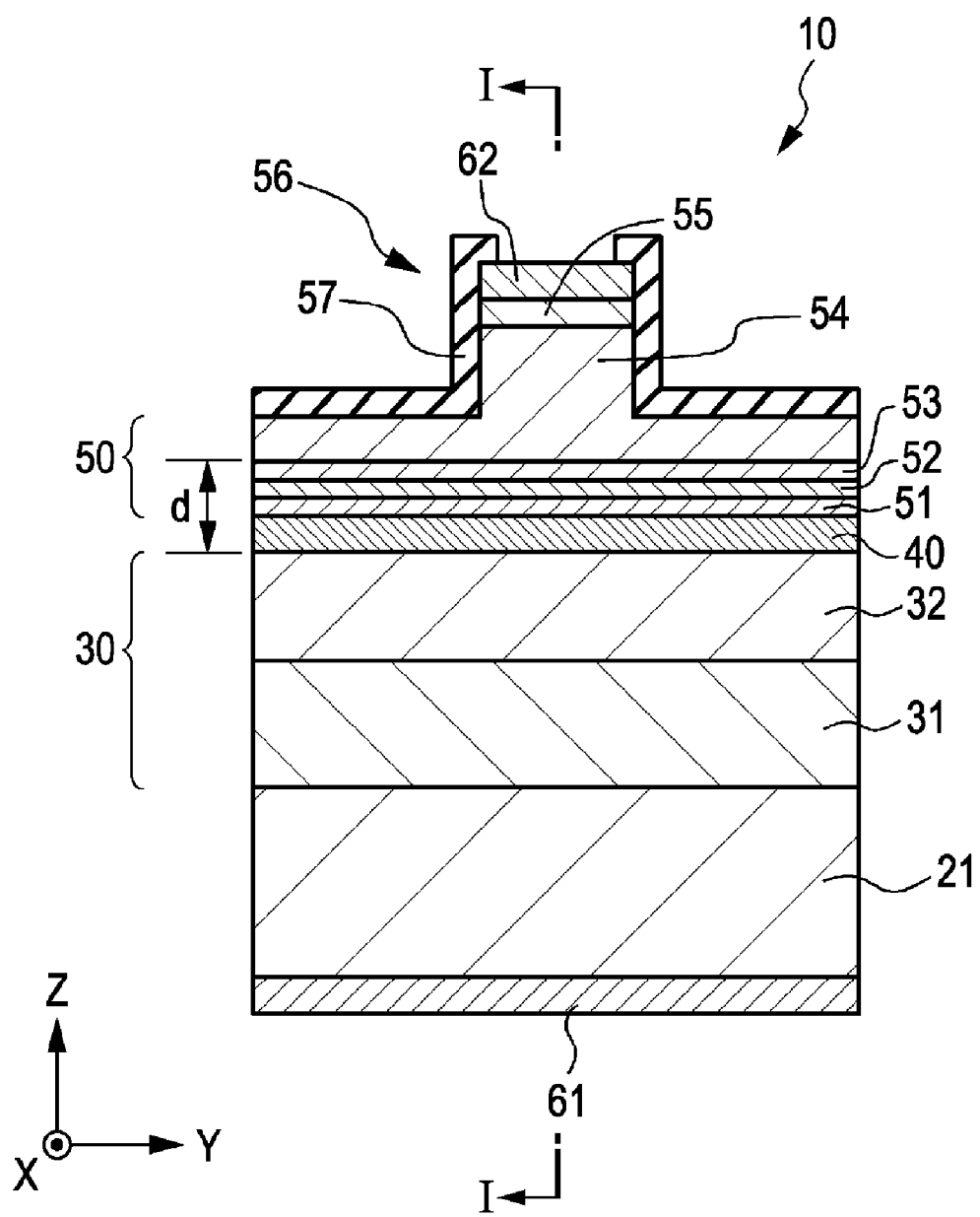
FIG. 2 is a schematic sectional view of the bi-section semiconductor laser device of Example 1 in a direction perpendicular to the direction in which the cavity extends.

Example 1 relates to a method for manufacturing a bi-section semiconductor laser device according to an embodiment of the present invention, bi-section semiconductor laser devices according to first and second embodiments of the present invention, or a method for driving the same. FIG. 1 is a schematic end view (a schematic end view taken along an XZ plane) of a bi-section semiconductor laser device of Example 1 in a direction in which a cavity extends. FIG. 2 is a schematic sectional view (a schematic sectional view taken along a YZ plane) in a direction perpendicular to the direction in which the cavity extends. FIG. 1 is a schematic end view taken along line I-I of FIG. 2. FIG. 2 is a schematic sectional view taken along line II-II of FIG. 1.

A bi-section semiconductor laser device 10 of Example 1 having an emission wavelength of 405 nm includes:

(a) a stacked structure obtained by stacking, in sequence, a first compound semiconductor layer 30 of a first conductivity type (specifically, an n conductivity type in Example 1) composed of a GaN compound semiconductor, a compound semiconductor layer (active layer 40) that constitutes a light-emitting region (gain region) 41 and a saturable absorption region 42 each composed of a GaN compound semiconductor, and a second compound semiconductor layer 50 of a second conductivity type (specifically, a p conductivity type in this Example 1) different from the first conductivity type composed of a GaN compound semiconductor;

(b) a belt-shaped second electrode 62 formed on the second compound semiconductor layer 50; and (c) a first electrode 61 electrically connected to the first compound semiconductor layer 30.

The bi-section semiconductor laser device 10 of Example 1 is specifically a semiconductor laser device having a ridge stripe-type SCH structure. More specifically, the bi-section semiconductor laser device 10 is an index-guided GaN semiconductor laser device that is composed of AlGaInN, is developed for the Blu-ray optical disk system, and has a ridge structure (ridge stripe structure). The bi-section semiconductor laser device 10 is disposed on a (0001) surface of an n-type GaN substrate 21. The active layer 40 has a quantum well structure. The (0001) surface of the n-type GaN substrate 21 is also called "C surface", which is a crystal face having a polarity. The first compound semiconductor layer 30, the active layer 40, and the second compound semiconductor layer 50 are specifically each composed of an AlGaInN compound semiconductor and more specifically have a layer structure shown in Table 1. In Table 1, compound semiconductor layers described in lower positions are closer to the n-type GaN substrate 21. The band gap of the compound semiconductor constituting a well layer in the active layer 40 is 3.06 eV.

TABLE 1

| | |
|---|---|
| Second compound semiconductor layer | 50 |
| p-type GaN contact layer (Mg-doped) | 55 |
| p-type GaN (Mg-doped)/AlGaN superlattice cladding layer | 54 |
| p-type AlGaN electron barrier layer (Mg-doped) | 53 |
| non-doped AlGaN cladding layer | 52 |
| non-doped GaInN light guide layer | 51 |
| Active layer | 40 |
| GaInN quantum well active layer (well layer: $Ga_{0.92}In_{0.08}N$/barrier layer: $Ga_{0.98}In_{0.02}N$) | |
| First compound semiconductor layer | 30 |
| n-type GaN cladding layer | 32 |
| n-type AlGaN cladding layer | 31 |
| Herein, | |
| well layer (two layers): 10.5 nm (non-doped) | |
| barrier layer (three layers): 14 nm (non-doped) | |

Part of the p-type GaN contact layer 55 and the p-type GaN/AlGaN superlattice cladding layer 54 is removed by reactive ion etching (RIE) and a ridge structure (ridge portion 56) is formed. A stacked insulating film 57 composed of $SiO_2$/Si is formed on both sides of the ridge portion 56. A $SiO_2$ layer is a lower layer and a Si layer is an upper layer. Herein, the difference in an effective refractive index between the ridge portion 56 and the stacked insulating film 57 is $5 \times 10^{-3}$ to $1 \times 10^{-2}$, specifically $7 \times 10^{-3}$. A second electrode (p-side ohmic electrode) 62 is formed on the p-type GaN contact layer 55 corresponding to the top face of the ridge portion 56. On the other hand, a first electrode (n-side ohmic electrode) 61 composed of Ti/Pt/Au is formed on the back of the n-type GaN substrate 21.

Figure 3:
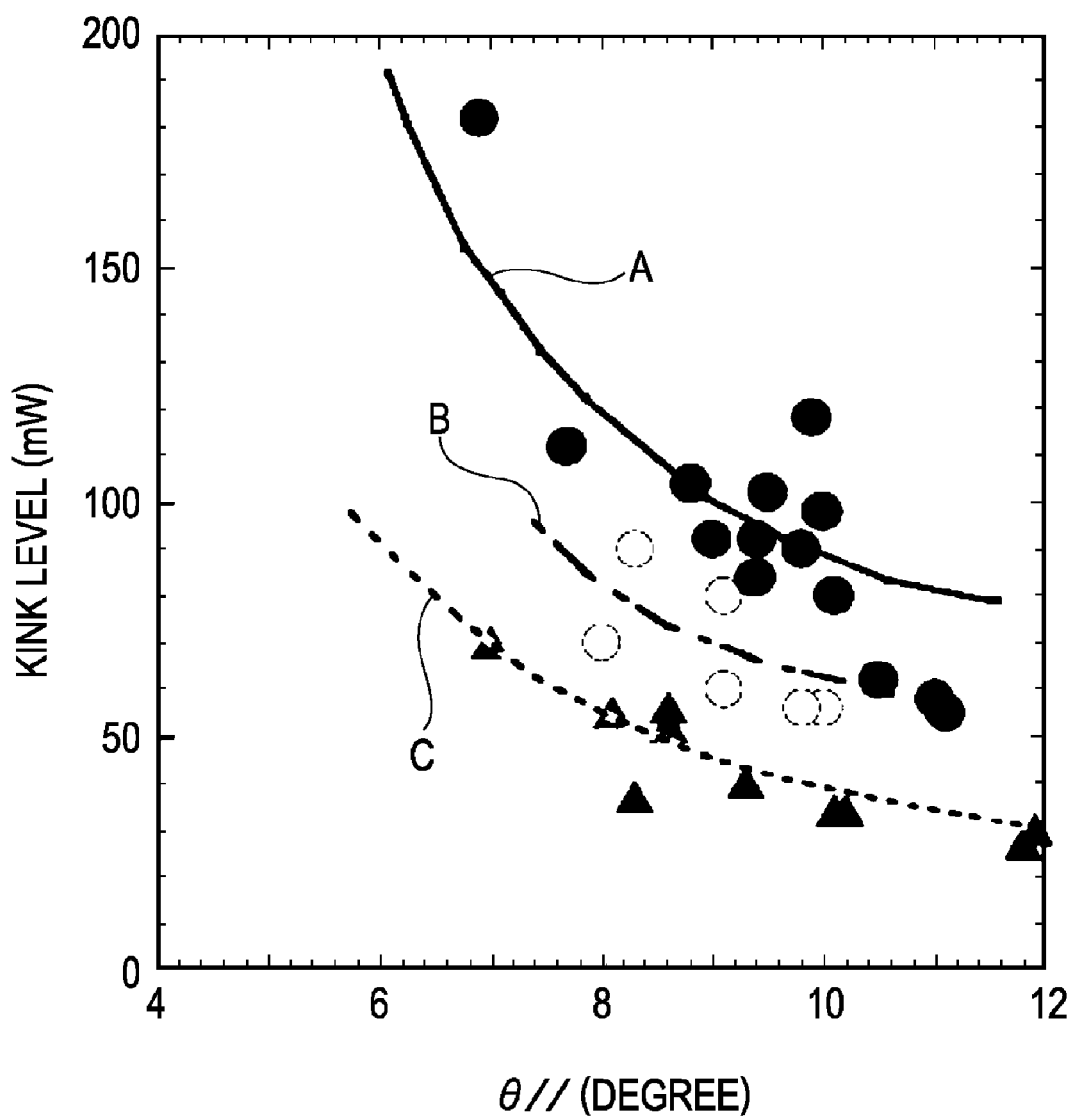
FIG. 3 is a graph showing the relationship between the material constituting a stacked insulating film formed on a ridge structure, the width of the ridge structure, the radiation angle (half-angle of beam radiation in a horizontal direction: θ//) of laser beams in the direction parallel to the active layer, the laser beams being emitted from the end face of the semiconductor laser device, and the kink level.

FIG. 3 shows the relationship between the material constituting the stacked insulating film 57, the width of the ridge structure, the radiation angle (half-angle of beam radiation in a horizontal direction: θ//) of laser beams in the direction parallel to the active layer, the laser beams being emitted from the end face of the semiconductor laser device 10, and the kink level (optical output when a kink is caused in the L-I characteristic). A curved line "A" represents the case where the stacked insulating film 57 is composed of $SiO_2$/Si and the width of the ridge structure is 1.5 μm. A curved line "B" represents the case where the stacked insulating film 57 is composed of $SiO_2$/Si and the width of the ridge structure is 1.7 μm. A curved line "C" represents the case where the stacked insulating film 57 is composed of a $SiO_2$ single layer and the width of the ridge structure is 1.7 μm. Referring to FIG. 3, the case where the stacked insulating film 57 is composed of a $SiO_2$/Si laminated structure and the width of the ridge structure is 1.5 μm is adopted to obtain high kink level.

Figure 4:
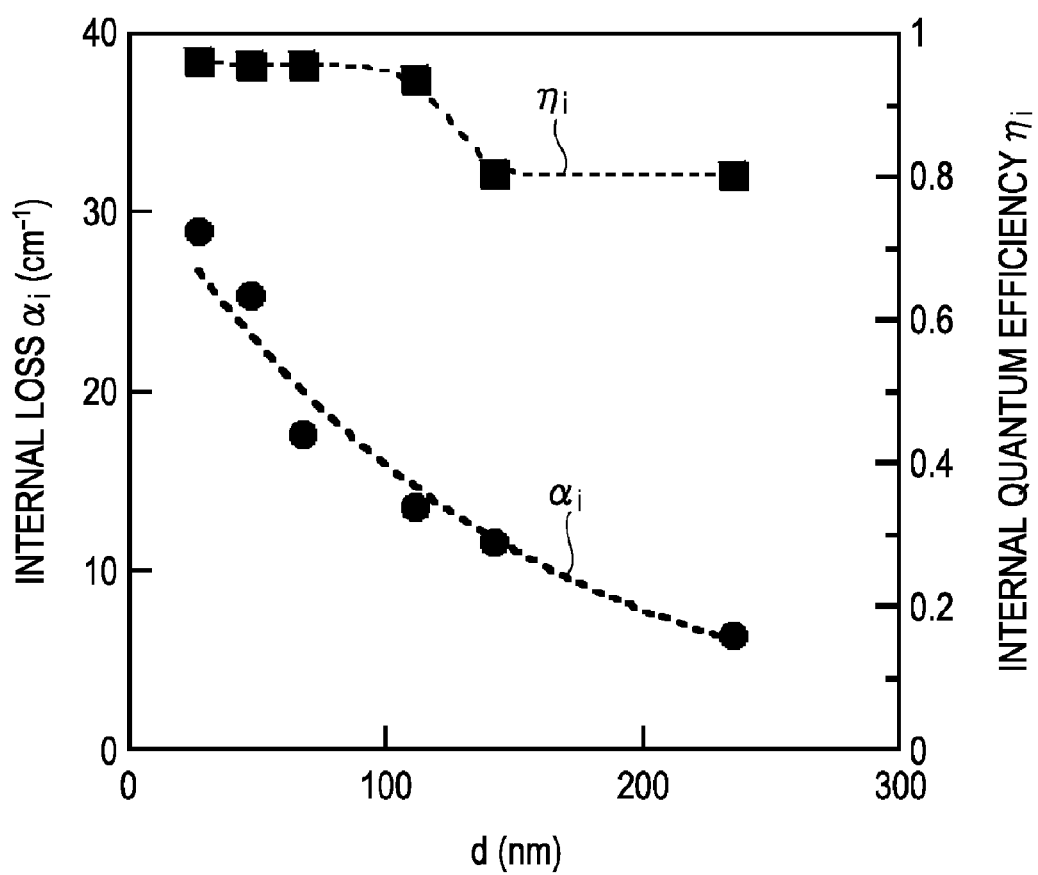
FIG. 4 is a graph showing the results of an internal loss and an internal quantum efficiency measured by manufacturing semiconductor lasers having various distances d from an active layer of a GaN semiconductor laser device to a p-type AlGaN electron barrier layer.

In the semiconductor laser device 10 of Example 1, internal loss is suppressed without decreasing an internal quantum efficiency by not overlaying the p-type AlGaN electron barrier layer 53, the p-type GaN/AlGaN superlattice cladding layer 54, and the p-type GaN contact layer 55, all of which are Mg-doped compound semiconductor layers, on the optical density distribution generated from the active layer 40 and the vicinity thereof as much as possible. This reduces the threshold current density at which laser oscillation is started. Semiconductor laser devices having various distances d from the active layer 40 to the p-type AlGaN electron barrier layer 53 were actually manufactured to obtain the internal loss $α_i$ and the internal quantum efficiency $η_i$. FIG. 4 shows the results. Referring to FIG. 4, the internal loss $α_i$ decreases as the distance d increases. However, when the distance d exceeds a certain value, the injection efficiency of holes to a well layer decreases and thus the probability of recombination between electrons and holes decreases in the active layer, which reduces the internal quantum efficiency $\eta_i$. From the above-described results, the distance d from the active layer 40 to the p-type AlGaN electron barrier layer 53 is set to 0.10 µm. The height of the ridge portion (ridge structure) is set to 0.30 µm. The thickness of the second compound semiconductor layer 50 located between the second electrode 62 and the active layer 40 is set to 0.50 µm. The thickness of the p-type GaN/AlGaN superlattice cladding layer 54 located under the second electrode 62 is set to 0.40 µm.

In the bi-section semiconductor laser device 10 of Example 1, the second electrode 62 is separated by a separating groove 62C into a first portion 62A configured to provide a forward bias state by supplying a direct current to the first electrode 61 through the light-emitting region (gain region) 41 and a second portion 62B configured to apply an electric field to the saturable absorption region 42 (a second portion 62B configured to apply a reverse-bias voltage $V_{sa}$ to the saturable absorption region 42). Herein, the electrical resistance (may be referred to as a "separation resistance") between the first portion 62A and the second portion 62B of the second electrode 62 is 1×10 times or more, specifically 1.5×10$^3$ times or more the electrical resistance between the second electrode 62 and the first electrode 61. The electrical resistance (separation resistance) between the first portion 62A and the second portion 62B of the second electrode 62 is $1 \times 10^2 \Omega$ or more, specifically $1.5 \times 10^4 \Omega$ or more.

A second electrode 62 having a separation resistance of $1 \times 10^2 \Omega$ or more has to be formed on the second compound semiconductor layer 50. A GaN semiconductor laser device is different from a commonly used GaAs semiconductor laser device and the mobility in a p-type compound semiconductor is small. Therefore, without increasing the resistance by performing ion implantation or the like on the p-type second compound semiconductor layer 50, the second electrode 62 formed on the second compound semiconductor layer 50 is separated by the separating groove 62C, whereby the electrical resistance between the first portion 62A and the second portion 62B of the second electrode 62 can be brought to 10 times or more the electrical resistance between the second electrode 62 and the first electrode 61 or the electrical resistance between the first portion 62A and the second portion 62B of the second electrode 62 can be brought to $1 \times 10^2 \Omega$ or more.

The characteristics that are necessary for the second electrode 62 are as follows:
(1) the second electrode 62 functions as an etching mask when the second compound semiconductor layer 50 is etched;
(2) the second electrode 62 can be wet etched without degrading the optical and electrical characteristics of the second compound semiconductor layer 50;
(3) the second electrode 62 has a contact resistivity of $10^{-2}$ $\Omega \cdot cm^2$ or less when formed on the second compound semiconductor layer 50;
(4) when a laminated structure is adopted, a material constituting a lower metal layer has a large work function, has a contact resistivity lower than that of the second compound semiconductor layer 50, and can be wet etched; and
(5) when a laminated structure is adopted, a material constituting an upper metal layer has resistance against etching (e.g., $Cl_2$ gas used during RIE) performed when a ridge structure is formed and can be wet etched.

In Example 1, the second electrode 62 is composed of a Pd single layer having a thickness of 0.1 µm.

In Example 1, the cavity length is set to 0.60 mm; the length of the saturable absorption region 42 is set to 0.05 mm; the lengths of the first portion 62A and the second portion 62B of the second electrode 62 are set to 0.53 mm and 0.05 mm, respectively; and the width (the length in the direction of a cavity) of the separating groove 62C is set to 0.02 mm.

The p-type GaN/AlGaN superlattice cladding layer 54 having a superlattice structure obtained by alternately stacking p-type GaN layers and p-type AlGaN layers has a thickness of 0.7 µm or less, specifically 0.4 µm or less. Each of the p-type GaN layers constituting the superlattice structure has a thickness of 2.5 nm and each of the p-type AlGaN layers constituting the superlattice structure has a thickness of 2.5 nm. The total number of the p-type GaN layers and the p-type AlGaN layers is 160 layers. The distance from the active layer 40 to the second electrode 62 is 1 µm or less, specifically 0.5 µm. Furthermore, $1 \times 10^{19}$ cm$^{-3}$ or more (specifically $2 \times 10^{19}$ cm$^{-3}$) of Mg is doped into the p-type AlGaN electron barrier layer 53, the p-type GaN/AlGaN superlattice cladding layer 54, and the p-type GaN contact layer 55 constituting the second compound semiconductor layer 50. The absorption coefficient of the second compound semiconductor layer 50 with respect to light with a wavelength of 405 nm is at least 50 cm$^{-1}$, specifically 65 cm$^{-1}$. The second compound semiconductor layer 50 includes, from the active layer side, non-doped compound semiconductor layers (non-doped GaInN light guide layer 51 and non-doped AlGaN cladding layer 52) and p-type compound semiconductor layers. The distance (d) from the active layer to the p-type compound semiconductor layers (specifically, the p-type AlGaN electron barrier layer 53) is $1.2 \times 10^{-7}$ m or less, specifically 100 nm.

Figure 12:
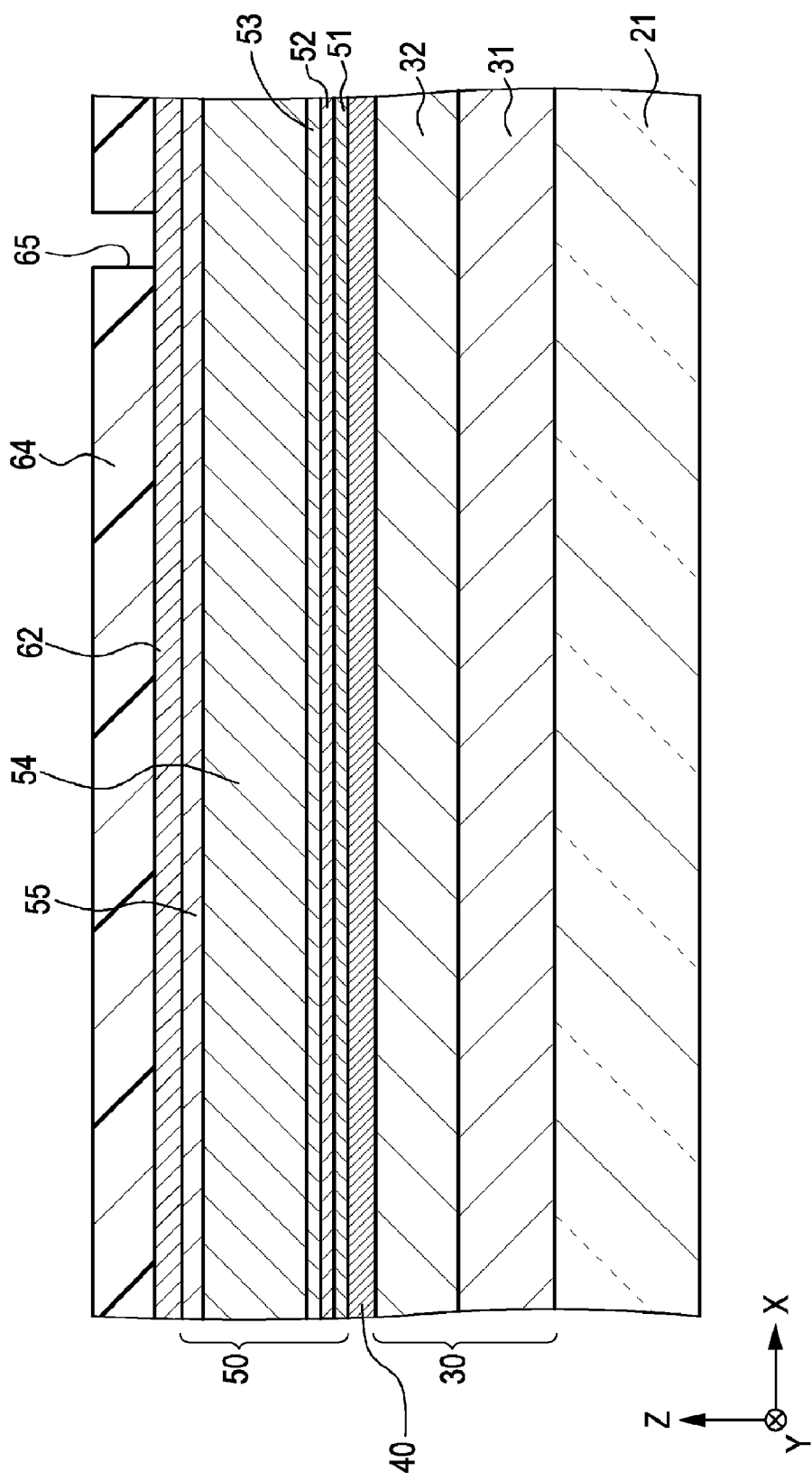
FIG. 12 is a schematic partial end view of a substrate and the like for describing the method for manufacturing the bi-section semiconductor laser device of Example 1, the step shown in FIG. 12 being performed after the step shown in FIG. 11B.

A method for manufacturing a bi-section semiconductor laser device of Example 1 will now be described with reference to FIGS. 10A, 10B, 11A, 11B, and 12. FIGS. 10A, 10B, 11A, and 11B are schematic partial sectional views taken along a YZ plane of a substrate and the like. FIG. 12 is a schematic partial end view taken along an XZ plane of a substrate and the like.

Step-100

Figure 10A:
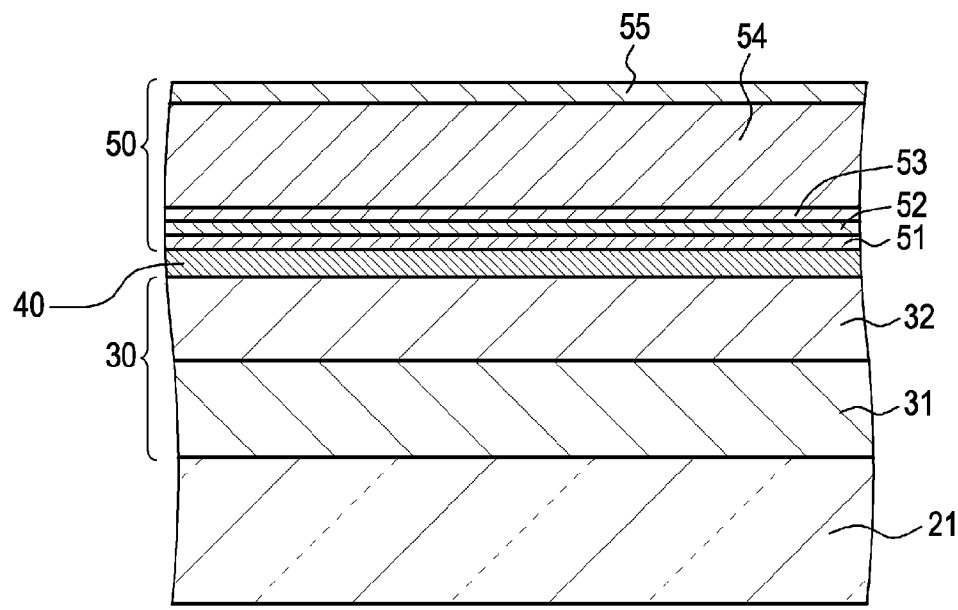
FIGS. 10A and 10B are schematic partial sectional views of a substrate and the like for describing a method for manufacturing the bi-section semiconductor laser device of Example 1.
Figure 10B:
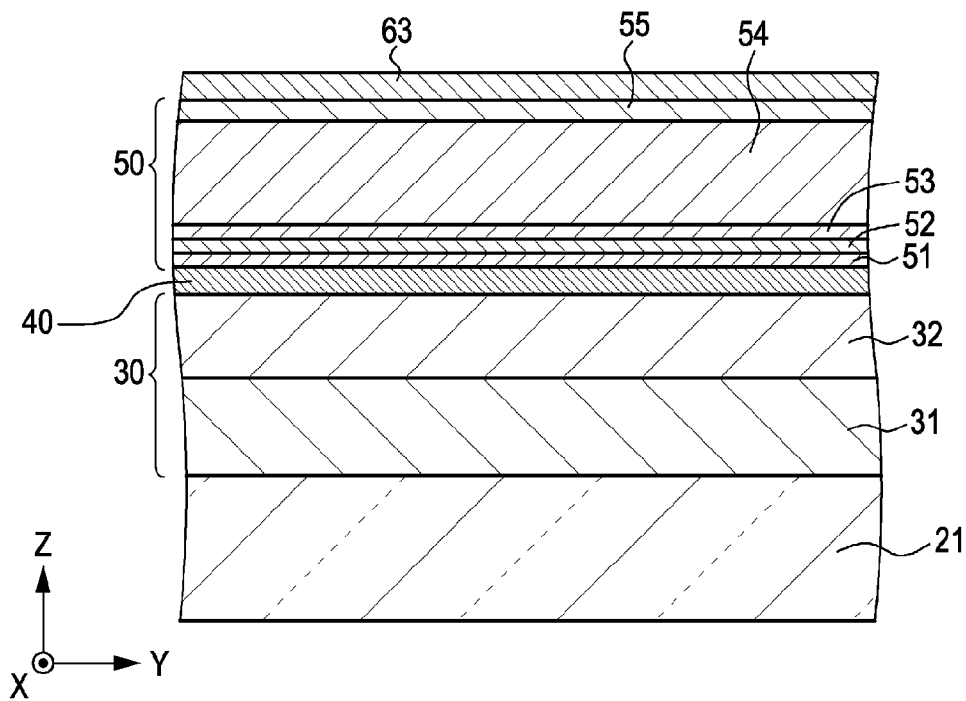
Figure 11A:
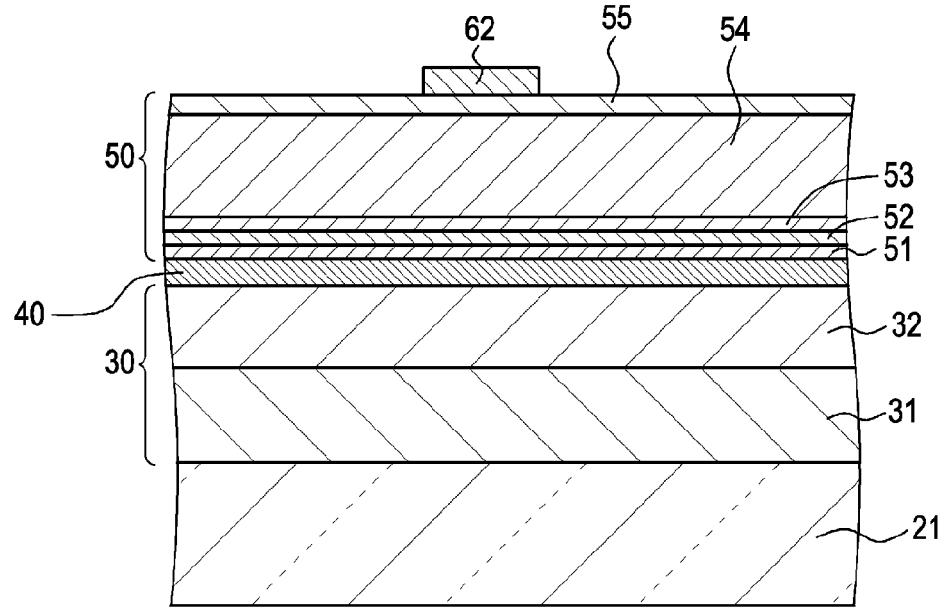
FIGS. 11A and 11B are schematic partial sectional views of a substrate and the like for describing the method for manufacturing the bi-section semiconductor laser device of Example 1, the step shown in FIG. 11A being performed after the step shown in FIG. 10B.
Figure 11B:
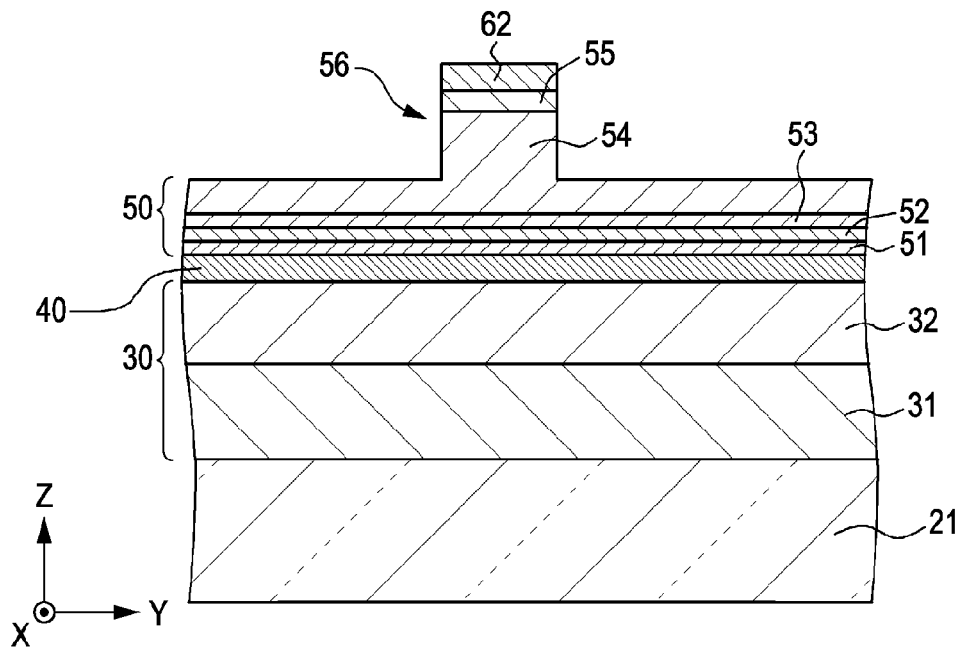

First, by commonly used MOCVD, there is formed a stacked structure obtained by stacking, in sequence, a first compound semiconductor layer 30 of a first conductivity type (n conductivity type) composed of a GaN compound semiconductor, a compound semiconductor layer (active layer 40) that constitutes a light-emitting region (gain region) 41 and a saturable absorption region 42 each composed of a GaN compound semiconductor, and a second compound semiconductor layer 50 of a second conductivity type (p conductivity type) different from the first conductivity type composed of a GaN compound semiconductor, on a substrate, that is, the (0001) surface of an n-type GaN substrate 21 (refer to FIG. 10A).

Step-110

A belt-shaped second electrode 62 is then formed on the second compound semiconductor layer 50. Specifically, after a Pd layer 63 is entirely formed by vacuum deposition (refer to FIG. 10B), a belt-shaped resist layer for etching is formed on the Pd layer 63 by photolithography. The Pd layer 63 not covered with the resist layer is removed using aqua regia, and the resist layer is then removed. Thus, the structure shown in FIG. 11A can be obtained. The belt-shaped second electrode 62 may be formed on the second compound semiconductor layer 50 by lift-off.

Step-120

A ridge structure is formed by etching at least part of the second compound semiconductor layer 50 (by etching part of the second compound semiconductor layer 50 in Example 1)

using the second electrode 62 as an etching mask. Specifically, part of the second compound semiconductor layer 50 is etched by RIE with Cl$_2$ gas using the second electrode 62 as an etching mask. Thus, the structure shown in FIG. 11B can be obtained. A ridge structure is formed through self-alignment using, as an etching mask, the second electrode 62 patterned into a belt shape, whereby misalignment is not caused between the second electrode 62 and the ridge structure.

Step-130

A resist layer 64 for forming a separating groove in the second electrode 62 is then formed (refer to FIG. 12). An opening 65 for forming the separating groove is formed in the resist layer 64. Subsequently, a separating groove 62C is formed in the second electrode 62 by wet etching using the resist layer 64 as a wet-etching mask to separate the second electrode 62 into a first portion 62A and a second portion 62B. Specifically, the entire stacked structure is immersed in aqua regia used as an etching solution for about 10 seconds to form the separating groove 62C in the second electrode 62. The resist layer 64 is then removed. Thus, the structure shown in FIGS. 1 and 2 can be obtained. By adopting wet etching but not dry etching, the optical and electrical characteristics of the second compound semiconductor layer 50 are not degraded. Therefore, the light-emitting characteristics of the bi-section semiconductor laser device are not degraded. When dry etching is adopted, the internal loss $\alpha_i$ of the second compound semiconductor layer 50 increases, which may increase a threshold voltage or decrease an optical output. Assuming that the etching rate of the second electrode 62 is ER$_0$ and the etching rate of the stacked structure is ER', ER$_0$/ER$_1 \cong 1 \times 10^2$. Since there is a high etching selection ratio between the second electrode 62 and the second compound semiconductor layer 50, the second electrode 62 can be etched with certainty while the stacked structure is not etched (or is slightly etched).

Step-140

Subsequently, formation of an n-side electrode, cleavage of a substrate, and packaging are performed and thus the semiconductor laser device 10 can be manufactured.

In general, the resistance R ($\Omega$) of a semiconductor layer is represented by the following formula using the resistivity $\rho$ ($\Omega \cdot$m) of a material constituting the semiconductor layer, the length X$_0$ (m) of the semiconductor layer, the cross section S (m$^2$) of the semiconductor layer, carrier density n (cm$^{-3}$), electrical charge e (C), and mobility $\mu$ (m$^2$/Vs).

$$R=(\rho \cdot X_0)/S=X_0/(n \cdot e \cdot \mu S)$$

Since the mobility of a p-type GaN semiconductor is more than two orders of magnitude smaller than that of a p-type GaAs semiconductor, the electrical resistance is easily increased. Therefore, it is clear from the formula that a semiconductor laser device having a ridge structure whose cross section is small, for example, 1.5 μm in width and 0.35 μm in height, has a large electrical resistance.

Figure 5:
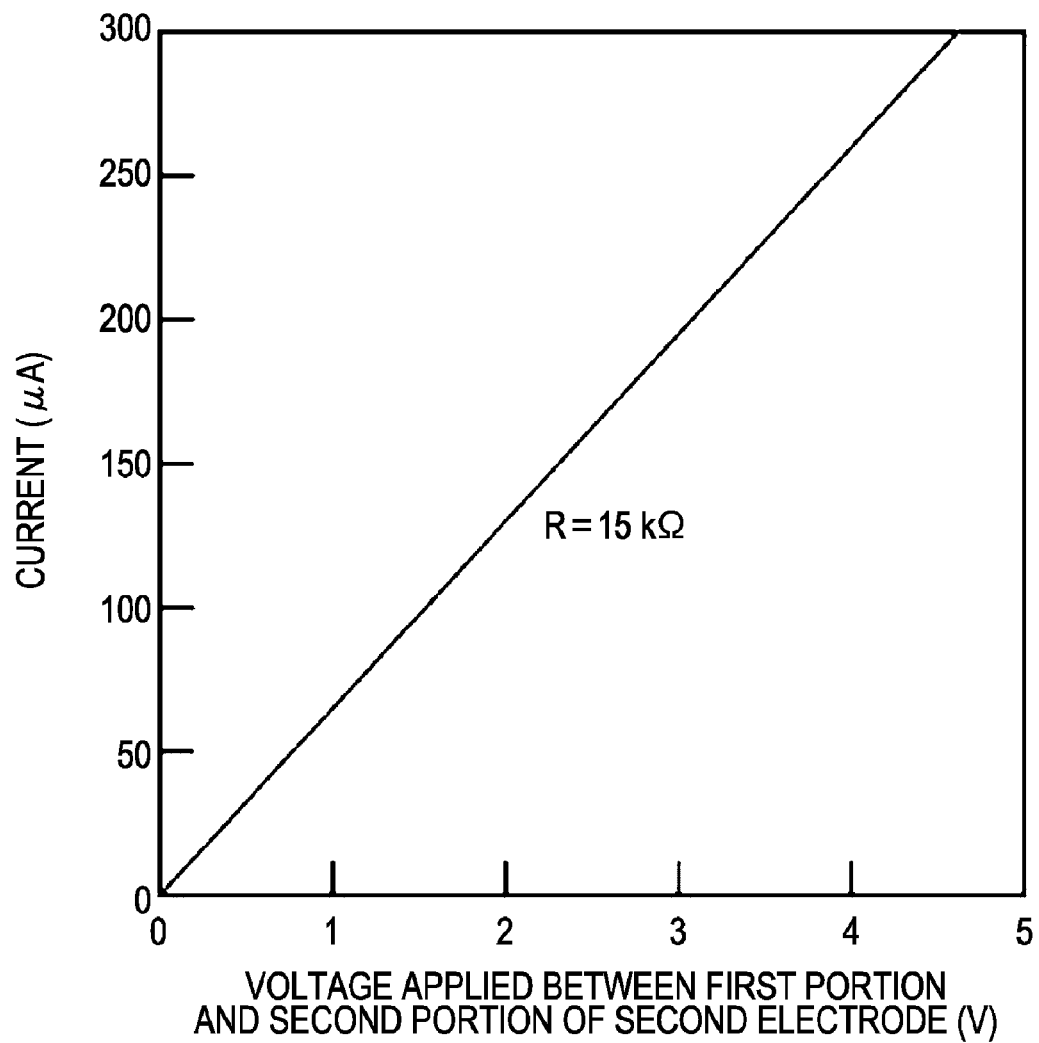
FIG. 5 is a graph showing a result of the electrical resistance between the first portion and the second portion of the second electrode of the bi-section semiconductor laser device manufactured in Example 1, the electrical resistance being measured by a four probe method.

FIG. 5 shows a result of the electrical resistance between the first portion 62A and the second portion 62B of the second electrode 62 of the manufactured bi-section semiconductor laser device 10 in Example 1, the electrical resistance being measured by a four probe method. When the width of the separating groove 62C is 20 μm, the electrical resistance between the first portion 62A and the second portion 62B of the second electrode 62 was 15 k$\Omega$.

The manufactured bi-section semiconductor laser device 10 of Example 1 was operated through self-pulsation by providing a forward bias state by supplying a direct current from the first portion 62A of the second electrode 62 to the first electrode 61 through the light-emitting region 41 and then by applying an electric field to the saturable absorption region 42 by applying a reverse bias voltage V$_{sa}$ between the first electrode 61 and the second portion 62B of the second electrode 62.

Figure 6:
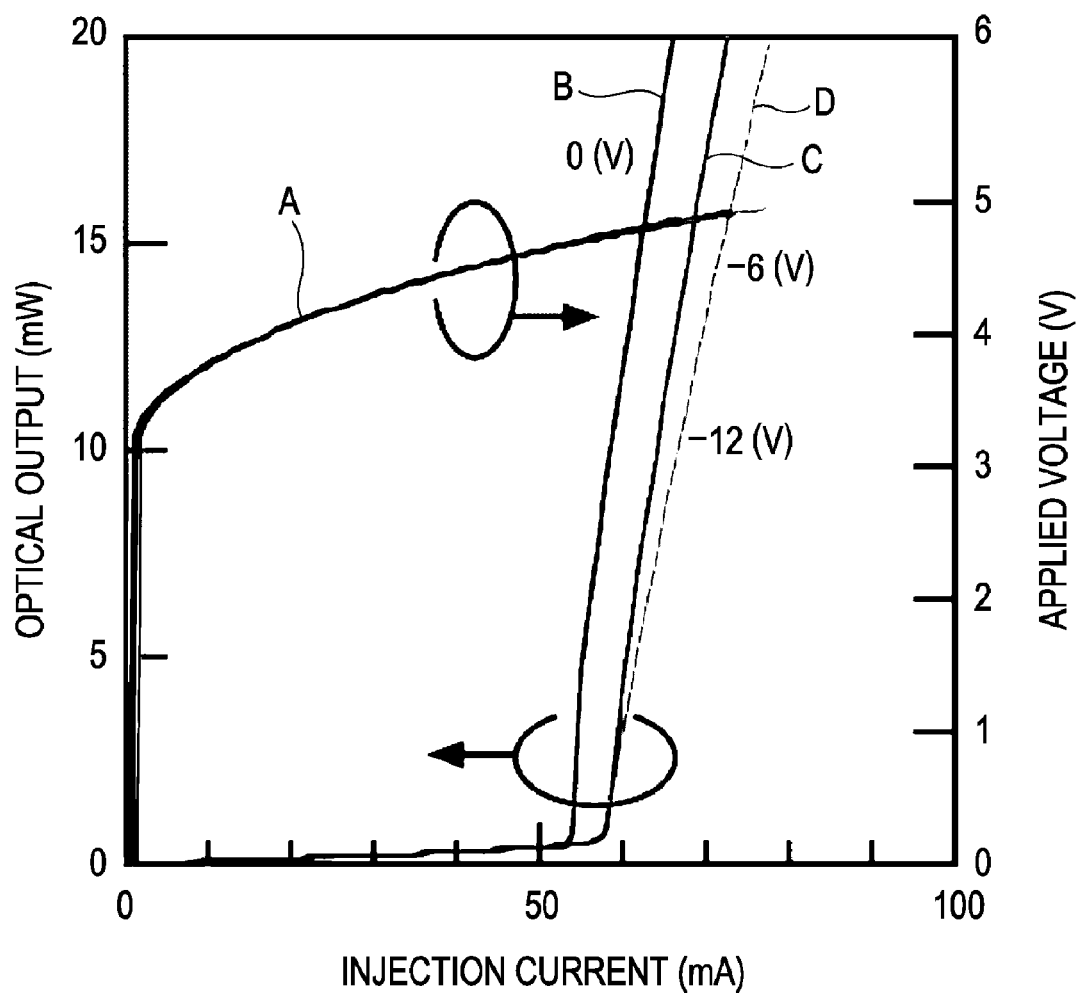
FIG. 6 is a graph showing the V-I characteristics and the L-I characteristics of the light-emitting region (gain region) when a reverse bias voltage $V_{sa}$ is applied to a saturable absorption region of the bi-section semiconductor laser device manufactured in Example 1.

Specifically, FIG. 6 shows the V-I characteristics and the L-I characteristics of the light-emitting region (gain region) 41 when a reverse bias voltage V$_{sa}$ is applied to the saturable absorption region 42. The relationships (L-I characteristics) between injected current and optical output when the voltages V$_{sa}$ applied to the second portion 62B of the second electrode 62 are 0, −6, and −12 V are represented by curved lines "B", "C", and "D" in FIG. 6, respectively. The relationships (V-I characteristics) between injected current and voltage V$_{gain}$ applied to the first portion 62A of the second electrode 62 when the voltages V$_{sa}$ applied to the second portion 62B of the second electrode 62 are 0, −6, and −12 V are represented by a curved line "A" in FIG. 6. Herein, the curved line "A" is seen as a single curved line because three curved lines obtained when the voltages V$_{sa}$ applied to the second portion 62B of the second electrode 62 are 0, −6, and −12 V overlap with each other.

By increasing the voltage V$_{sa}$ applied to the second portion 62B of the second electrode 62 to a voltage as large as −6 V or −12 V, the absorption in the saturable absorption region 42 became large, which increased a threshold voltage and decreased a slope efficiency. However, it was clear that the V-I characteristics of the light-emitting region 41 hardly varied. Thus, it was found that, in the bi-section semiconductor laser device 10 obtained by the method for manufacturing a bi-section semiconductor laser device of Example 1, a sufficiently large separation resistance (the electrical resistance between the first portion 62A and the second portion 62B of the second electrode 62) is obtained and electrical control can be independently performed on the first portion 62A and the second portion 62B of the second electrode 62. In the bi-section semiconductor laser device 10 of Example 1, no problems were caused even if a voltage of −12 V was applied to the saturable absorption region 42.

Figure 7:
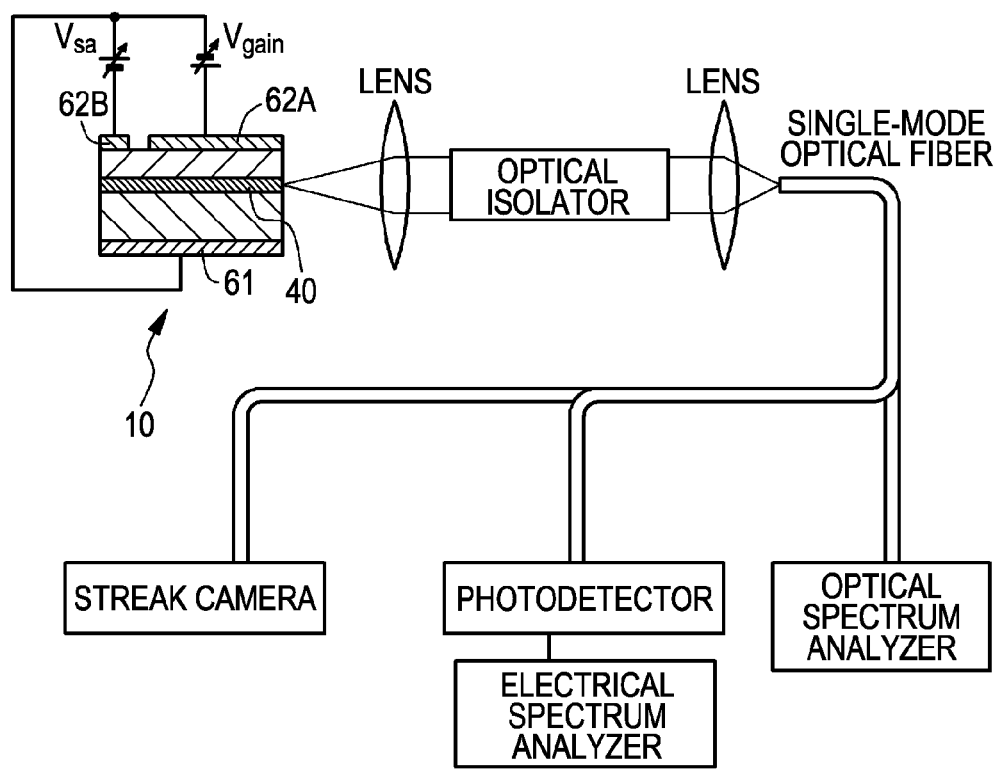
FIG. 7 schematically shows a measurement system used for evaluating the self-pulsation operation of the bi-section semiconductor laser device of Example 1.

FIG. 7 shows a measurement system used for evaluating the self-pulsation operation of the bi-section semiconductor laser device 10 of Example 1. In the measurement, a direct-current constant voltage V$_{sa}$ was applied to the saturable absorption region 42 to supply a constant direct current (voltage: V$_{gain}$) to the light-emitting region (gain region) 41. In other words, a negative direct-current constant voltage V$_{sa}$ was applied to the second portion 62B of the second electrode 62 to supply a constant direct current from the first portion 62A of the second electrode 62 to the first electrode 61. After the laser beams emitted from the bi-section semiconductor laser device 10 were collimated using a lens and passed through an optical isolator, the laser beams were coupled to a single-mode optical fiber using a lens. The light from the single-mode optical fiber was evaluated using a photodetector and an electrical spectrum analyzer, an optical spectrum analyzer, and a streak camera.

Figure 8A:
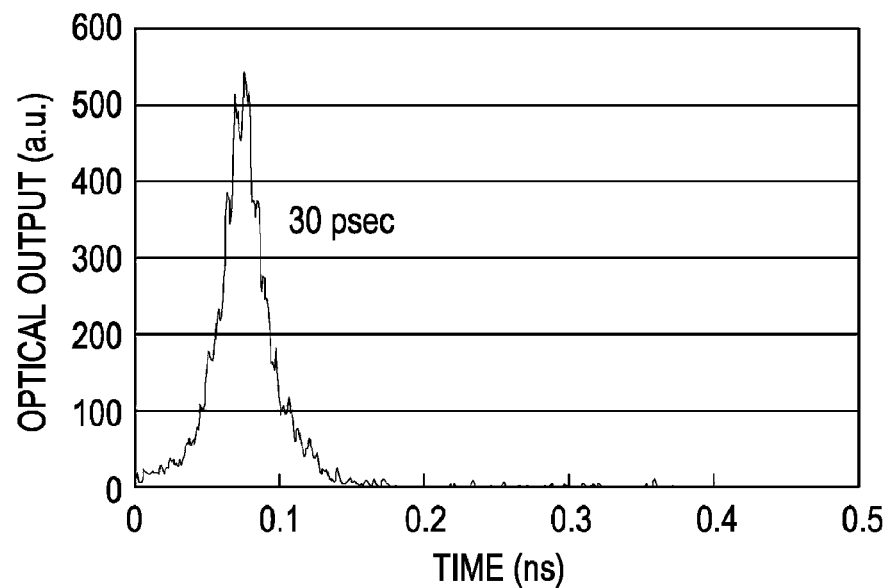
FIG. 8A is a graph showing an optical waveform measured using a streak camera in the bi-section semiconductor laser device of Example 1 and FIG. 8B is a graph showing the fundamental and harmonic waves of an electrical spectrum.
Figure 8B:
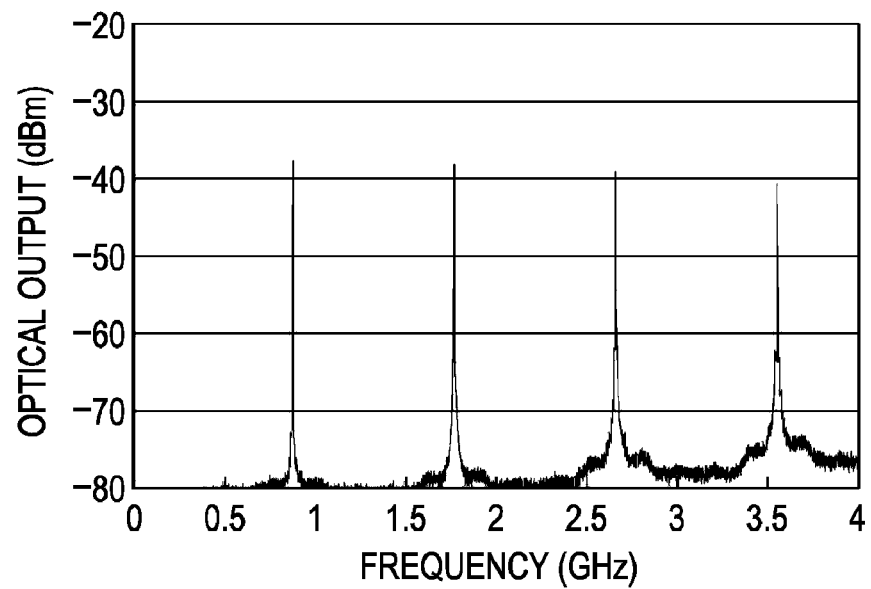
Figure 9A:
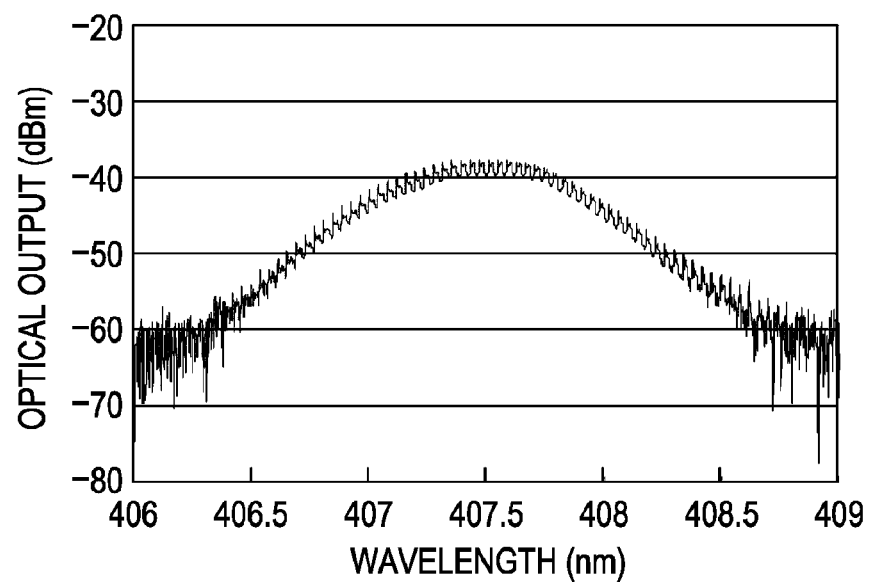
FIGS. 9A and 9B show that the bi-section semiconductor laser device of Example 1 has spectral line broadening of an optical spectrum that is unique to a bi-section semiconductor laser device.
Figure 9B:

FIGS. 8A, 8B, 9A, and 9B show the measurement results obtained when a voltage of −12 V is applied to the second portion 62B of the second electrode 62 of the bi-section semiconductor laser device 10 of Example 1 to supply a direct current of 150 mA from the first portion 62A of the second electrode 62 to the first electrode 61. As shown in FIGS. 9A and 9B, spectral line broadening of an optical spectrum that is unique to a bi-section semiconductor laser device was found. As shown in FIG. 8B, the fundamental wave of an electrical spectrum and the harmonic waves (the second harmonic wave, the third harmonic wave, and the fourth harmonic wave are shown in FIG. 8B) were measured. Furthermore, to evaluate the time-domain waveform of a pulse, an optical waveform was measured using the streak camera. As shown in FIG. 8A, the pulse width of the optical pulse was 30 psec and the pulse peak power estimated from time-average power (65 mW/sec, about 65 pJ/pulse) was about 2.4 W. As far as the inventors of the present invention know, this test was the first case where a GaN semiconductor laser device has actually operated through self-pulsation in a single mode (single fundamental transverse mode) while a reverse bias is applied to the saturable absorption region of the bi-section semiconductor laser device.

As described above, the electrical resistance between the first portion 62A and the second portion 62B of the second electrode 62 is 10 times or more that between the second electrode 62 and the first electrode 61 or $1\times10^2 \Omega$ or more. Therefore, a leakage current flowing from the first portion 62A of the second electrode 62 to the second portion 62B can be suppressed with certainty. Consequently, the light-emitting region 41 can be brought to a forward bias state and the saturable absorption region 42 can be brought to a reverse bias state with certainty. This can achieve a self-pulsation operation in a single mode with certainty.

EXAMPLE 2

Example 2 is a modification of Example 1. In Example 1, the bi-section semiconductor laser device 10 is disposed on the (0001) surface of an n-type GaN substrate 21, that is, on the C surface. The (0001) surface is a crystal face having a polarity. However, when such a substrate is used, the active layer 40 is subjected to a quantum confined Stark effect (QCSE) due to an internal electric field caused by piezoelectric polarization and spontaneous polarization, whereby it sometimes becomes difficult to electrically control saturable absorption. It was found that, in some cases, a direct current supplied to the first electrode and a reverse bias voltage applied to the saturable absorption region have to be increased in order to achieve self-pulsation and mode locking operations; a subpulse component accompanying a main pulse is generated; or it becomes difficult to achieve synchronization between external signals and optical pulses.

As a result, it was found that, to prevent the occurrence of such phenomena, the thickness of the well layer constituting the active layer 40 and the doping concentration of an impurity in the barrier layer constituting the active layer 40 should be optimized.

Specifically, the thickness of the well layer constituting the GaInN quantum well active layer is 1 nm or more and 10.0 nm or less, preferably 1 nm or more and 8 nm or less. By decreasing the thickness of the well layer in such a manner, the effects caused by piezoelectric polarization and spontaneous polarization can be suppressed. The doping concentration of an impurity in the barrier layer is $1\times10^{18}$ cm$^{-3}$ or more and $1\times10^{20}$ cm$^{-3}$ or less, preferably $1\times10^{19}$ cm$^{-3}$ or more and $1\times10^{20}$ cm$^{-3}$ or less. Examples of the impurity include silicon (Si) and oxygen (O). By controlling the doping concentration of an impurity in the barrier layer in such a manner, the number of carriers in the active layer can be increased, which can suppress the effects caused by piezoelectric polarization and spontaneous polarization.

In Example 2, the active layer 40 constituted by the GaInN quantum well active layer having three barrier layers (Ga$_{0.98}$In$_{0.02}$N) and two well layers (Ga$_{0.92}$In$_{0.08}$N) shown in Table 1 has the structure below. For the bi-section semiconductor laser device of Reference Example 2, the active layer 40 with the layer structure shown in Table 1 has the structure below, which is the same as that of Example 1.

TABLE 2

| | Example 2 | Reference Example 2 |
|---|---|---|
| Well layer | 8 nm | 10.5 nm |
| Barrier layer | 12 nm | 14 nm |
| Doping concentration of impurity in well layer | non-doped | non-doped |
| Doping concentration of impurity in barrier layer | Si: $2 \times 10^{18}$ cm$^{-3}$ | non-doped |

In Example 2, the thickness of the well layer is 8 nm and the barrier layer is doped with Si at a concentration of $2\times10^{18}$ cm$^{-3}$, which reduces the QCSE in the active layer. In Reference Example 2, on the other hand, the thickness of the well layer is 10.5 nm and the barrier layer is not doped with an impurity.

Figure 13A:
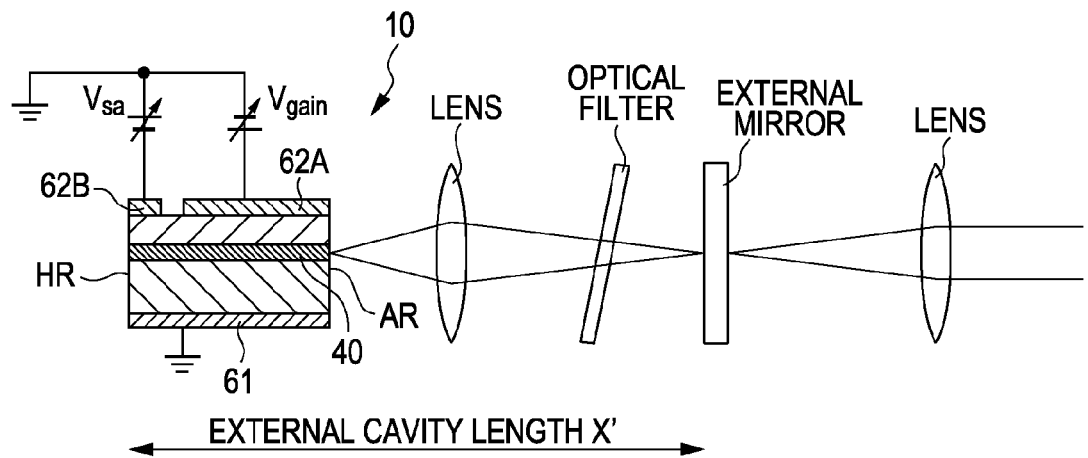
FIGS. 13A and 13B schematically show systems in which mode locking is performed by forming an external cavity using a bi-section semiconductor laser device of Example 2.

A mode locking operation was performed by forming a light-gathering external cavity using the bi-section semiconductor laser devices of Example 2 and Reference Example 2 (refer to FIG. 13A). In Example 2 and Reference Example 2, the cavity length is 0.60 mm; the length of the saturable absorption region 42 is 0.06 mm; the length of the first portion 62A of the second electrode 62 is 0.52 mm; the length of the second portion 62B is 0.06 mm; and the width (the length in the longitudinal direction of cavity) of the separating groove 62C is 0.02 mm. For the light-gathering external cavity shown in FIG. 13A, an external cavity is constituted by an external mirror and an end face of the bi-section semiconductor laser device on which a high reflective coating layer (HR) is formed on the saturable absorption region side, and an optical pulse is extracted from the external mirror. An anti-reflective coating layer (AR) is formed on the end face (light-emitting end face) on the light-emitting region (gain region) side of the bi-section semiconductor laser device. A band-pass filter is mainly used as an optical filter. The band-pass filter is inserted to control the oscillation wavelength of a laser. The repetition frequency f of an optical pulse train is determined in accordance with an external cavity length X' and represented by the following formula:

$$f=c/(2n \cdot X')$$

where c is the speed of light and n is a refractive index of a waveguide.

Figure 15A:
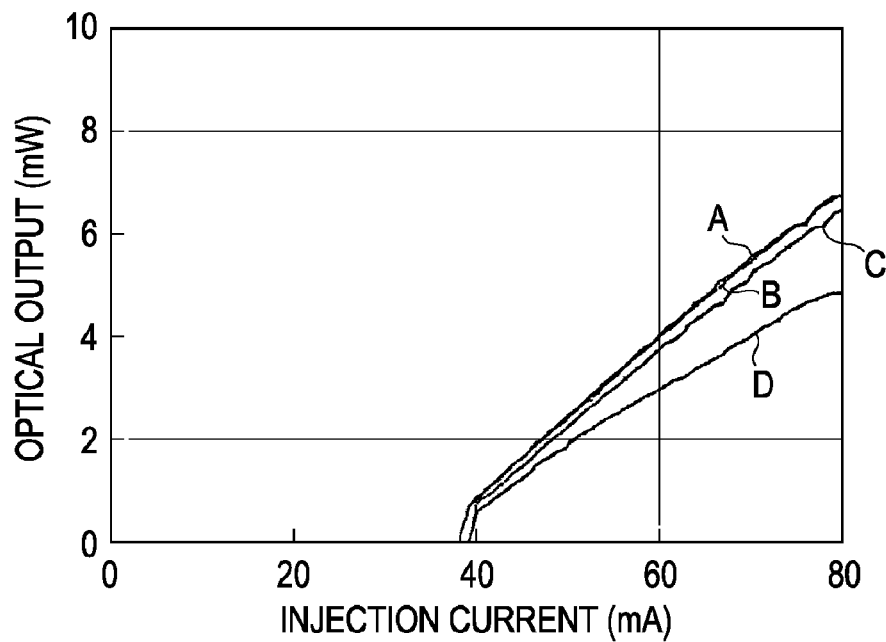
FIGS. 15A and 15B are graphs showing the measurement results of reverse bias voltage dependence of relationships (L-I characteristics) between injection current and optical output of Example 2 and Reference Example 2, respectively.
Figure 15B:
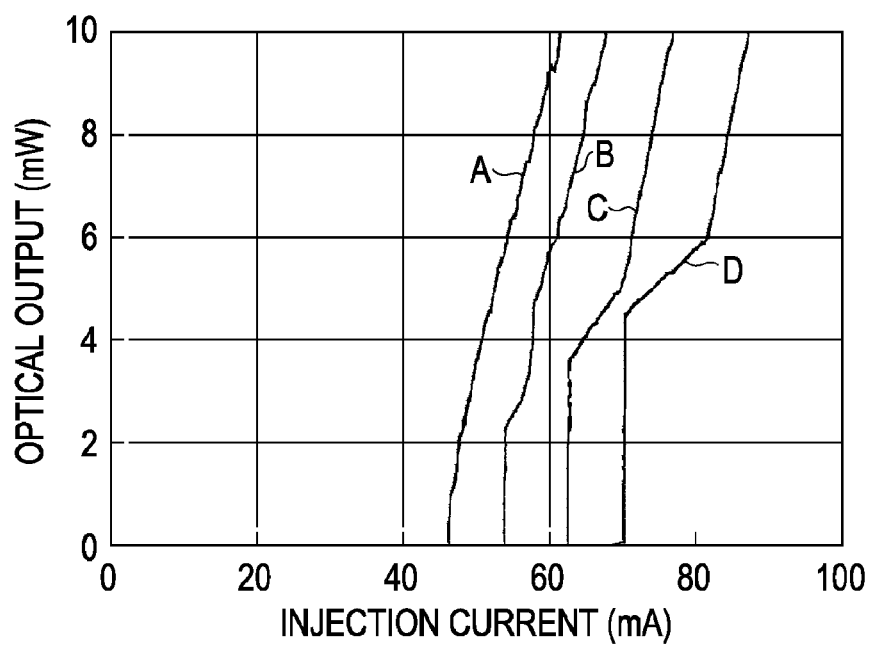

Mode locking is determined in accordance with a direct current applied to the light-emitting region and a reverse bias voltage $V_{sa}$ applied to the saturable absorption region. FIGS. 15A and 15B show the measurement results expressing the reverse bias voltage dependence of the relationships (L-I characteristics) between injection current and optical output of Example 2 and Reference Example 2, respectively. In FIGS. 15A and 15B, the measurement result indicated by symbol "A" is a result obtained when the reverse bias voltage $V_{sa}$ is 0 V. The measurement result indicated by symbol "B" is a result obtained when the reverse bias voltage $V_{sa}$ is −3 V. The measurement result indicated by symbol "C" is a result obtained when the reverse bias voltage $V_{sa}$ is −6 V. The measurement result indicated by symbol "D" is a result obtained when the reverse bias voltage $V_{sa}$ is −9 V. In FIG. 15A, most of the measurement result obtained when the reverse bias voltage $V_{sa}$ is 0 V overlaps the measurement result obtained when the reverse bias voltage $V_{sa}$ is −3 V.

It is clear from the comparison between FIGS. 15A and 15B that, in Reference Example 2, a threshold current at which laser oscillation is started gradually increases as the reverse bias voltage $V_{sa}$ increases, and a change occurs at a low reverse bias voltage $V_{sa}$ compared with Example 2. This means that, in the active layer of Example 2, the effect of saturable absorption is electrically controlled due to the reverse bias voltage $V_{sa}$.

Figure 16A:
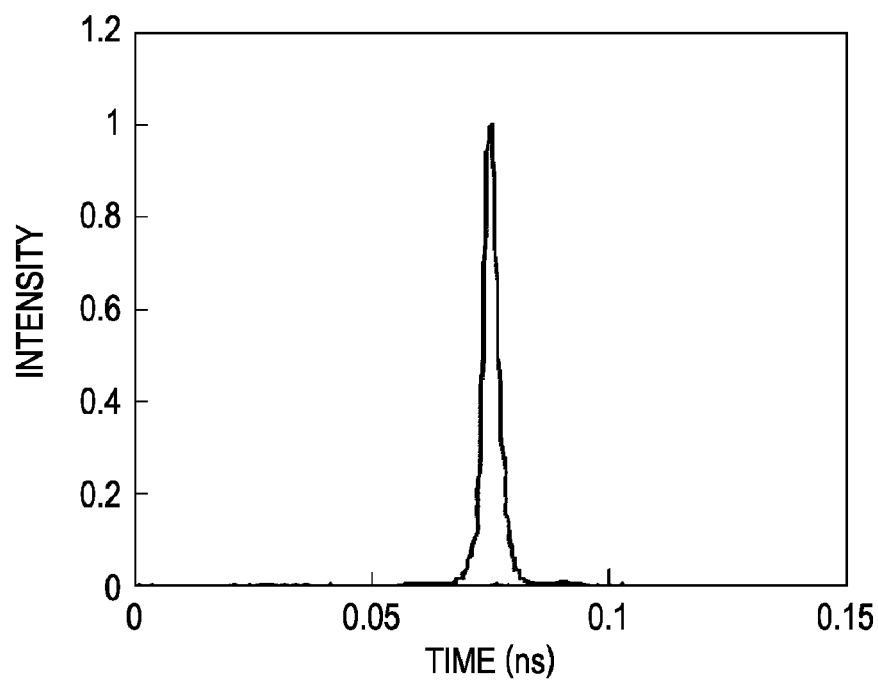
FIGS. 16A and 16B show the results obtained by measuring optical pulses generated in Example 2 and Reference Example 2 using a streak camera, respectively.
Figure 16B:
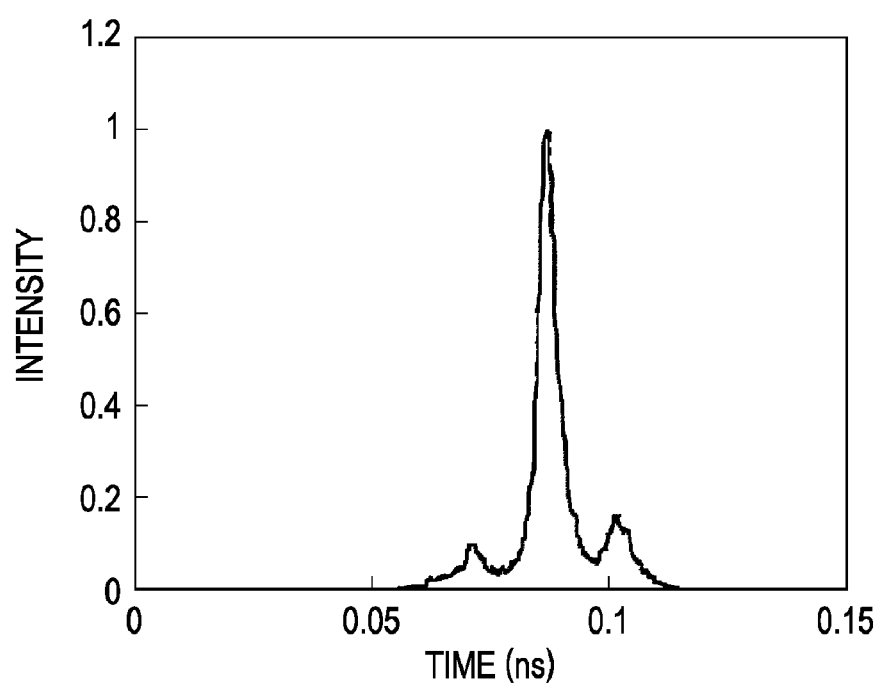

FIGS. 16A and 16B show the results obtained by measuring optical pulses generated in Example 2 and Reference Example 2 using a streak camera, respectively. In FIG. 16B, which shows the result of Reference Example 2, a subpulse component is generated before and after a main pulse. On the other hand, in FIG. 16A, which shows the result of Example 2, a subpulse component is not generated. It is believed that the suppression of the QCSE due to a structure of an active layer results in an increase in the effect of saturable absorption.

However, even in Reference Example 2, a self-pulsation operation in a single mode (single fundamental transverse mode) and a mode locking operation are confirmed while a reverse bias is applied to the saturable absorption region. Thus, it is obvious that Reference Example 2 is also included in the present invention.

Figure 13B:
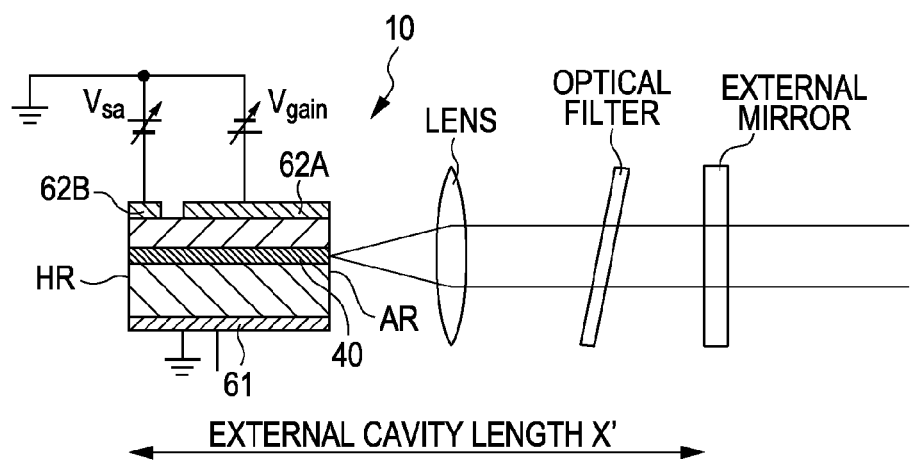
Figure 14A:
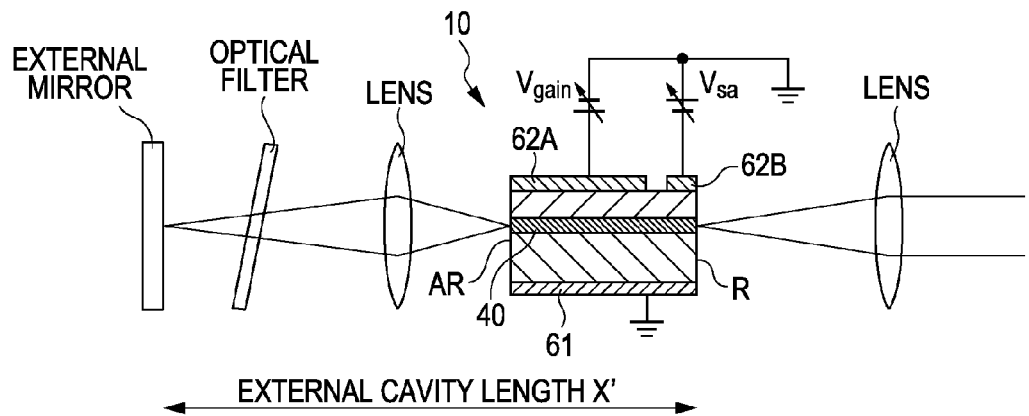
FIGS. 14A and 14B schematically show systems in which mode locking is performed by forming an external cavity using a bi-section semiconductor laser device of Example 2.
Figure 14B:
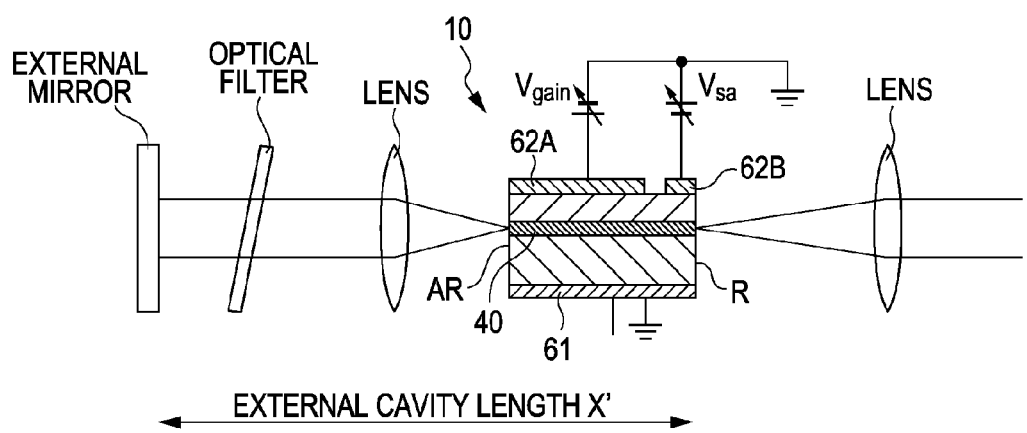

FIGS. 13B, 14A, and 14B show modifications of external cavities formed using bi-section semiconductor laser devices. For the collimating external cavity shown in FIG. 13B, an external cavity is also constituted by an external mirror and an end face of the bi-section semiconductor laser device on which a high reflective coating layer (HR) is formed on the saturable absorption region side, and an optical pulse is extracted from the external mirror. An anti-reflective coating layer (AR) is formed on the end face (light-emitting end face) on the light-emitting region (gain region) side of the bi-section semiconductor laser device. For the external cavities shown in FIGS. 14A and 14B, external cavities are each constituted by an external mirror and an end face of the bi-section semiconductor laser device on which a reflective coating layer (R) is formed on the saturable absorption region (light-emitting end face) side, and an optical pulse is extracted from the saturable absorption region. An anti-reflective coating layer (AR) is formed on the end face on the light-emitting region (gain region) side of the bi-section semiconductor laser device. The external cavity shown in FIG. 14A is a light-gathering external cavity. The external cavity shown in FIG. 14B is a collimating external cavity.

The present invention has been described on the basis of Examples, but is not limited to Examples. The configurations and structures of the semiconductor laser device described in Examples are mere examples and can be suitably modified. Various values described in Examples are also mere examples, and such values obviously change when the specifications of the semiconductor laser device used are changed. For example, the second electrode may have a laminated structure including a lower metal layer that has a thickness of 20 nm and is composed of palladium (Pd) and an upper metal layer that has a thickness of 200 nm and is composed of nickel (Ni). Herein, in the wet etching with aqua regia, the etching rate of nickel is about 1.25 times that of palladium.

Figure 17:
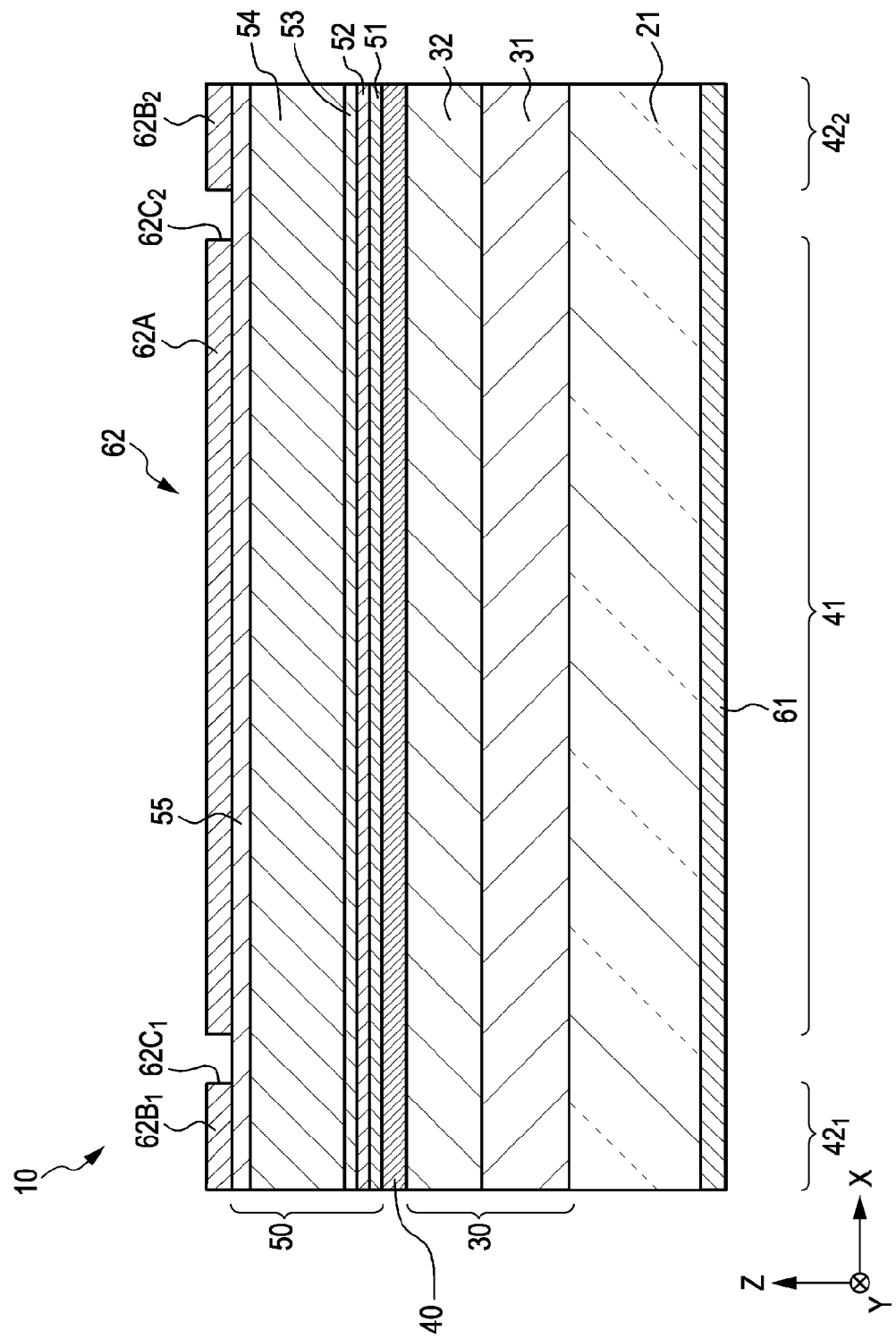
FIG. 17 is a schematic end view in a modification of the bi-section semiconductor laser device of Example 1 in a direction in which the cavity of the bi-section semiconductor laser device extends.

The number of the light-emitting region 41 and the saturable absorption region 42 is not limited to one. FIG. 17 is a schematic end view of a bi-section semiconductor laser device in which a single first portion 62A of the second electrode and two second portions 62B$_1$ and 62B$_2$ of the second electrode are formed. In this bi-section semiconductor laser device, the first portion 62A has one end that faces one second portion 62B$_1$ through one separating groove 62C$_1$ and the other end that faces the other second portion 62B$_2$ through the other separating groove 62C$_2$. A single light-emitting region 41 is sandwiched by two saturable absorption regions 42$_1$ and 42$_2$. Alternatively, FIG. 18 is a schematic end view of a bi-section semiconductor laser device in which two first portions 62A$_1$ and 62A$_2$ of the second electrode and a single second portion 62B of the second electrode are formed. In this bi-section semiconductor laser device, the second portion 62B has one end that faces one first portion 62A$_1$ through one separating groove 62C$_1$ and the other end that faces the other first portion 62A$_2$ through the other separating groove 62C$_2$. A single saturable absorption region 42 is sandwiched by two light-emitting regions 41$_1$ and 41$_2$.

In Examples, the self-oscillating semiconductor laser device 10 is disposed on the {0001} surface also called C surface, which is a polar surface of the n-type GaN substrate 21. Alternatively, the self-oscillating semiconductor laser device 10 may be disposed on a nonpolar surface such as a {11-20} surface also called A surface, a {1-100} surface also called M surface, or a {1-102} surface or on a semipolar surface such as a {11-2n} surface including a {11-24} surface and a {11-22} surface, a {10-11} surface, or a {10-12} surface. This can solve the problems described in Example 2.

The present application contains subject matter related to that disclosed in Japanese Priority Patent Applications JP 2009-077070 filed in the Japan Patent Office on Mar. 26, 2009 and JP 2010-031299 filed in the Japan Patent Office on Feb. 16, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a bi-section semiconductor laser device, comprising the steps of:
   (A) forming a stacked structure by stacking on a substrate, in sequence, a first compound semiconductor layer of a first conductivity type composed of a GaN compound semiconductor, a compound semiconductor layer that constitutes a light-emitting region and a saturable absorption region each composed of a GaN compound semiconductor, and a second compound semiconductor layer of a second conductivity type different from the first conductivity type composed of a GaN compound semiconductor;
   (B) forming a belt-shaped second electrode on the second compound semiconductor layer;
   (C) forming a ridge structure by etching at least part of the second compound semiconductor layer using the belt-shaped second electrode as an etching mask; and
   (D) forming a resist layer on the belt-shaped second electrode for forming a separating groove in the belt-shaped second electrode and then forming the separating groove in the belt-shaped second electrode by wet etching using the resist layer as a wet-etching mask so that the separating groove separates the belt-shaped second electrode into a first portion and a second portion.

2. The method according to claim 1, wherein, in the step (D), assuming that an etching rate of the second electrode is ER$_0$ and an etching rate of the stacked structure is ER$_1$ when the separating groove is formed in the second electrode, ER$_0$/ER$_1 \geq 1 \times 10$ is satisfied.

3. The method according to claim 2, wherein:
   the second electrode is composed of a palladium single layer, a nickel single layer, a platinum single layer, or a laminated structure having a lower metal layer and an upper metal layer, the lower metal layer being in contact with the second compound semiconductor layer;

the lower metal layer is composed of a single metal selected from a group consisting of palladium, nickel, and platinum; and the upper metal layer is composed of a metal whose etching rate when the separating groove is formed in the belt-shaped second electrode in the step (D) is equal to or higher than an etching rate of the lower metal layer.

4. The method according to claim 2, wherein the belt-shaped second electrode is composed of a palladium single layer.

5. The method according to claim 2, wherein an etching solution used in forming the separating groove is aqua regia, nitric acid, sulfuric acid, hydrochloric acid, or a mixed solution of at least two selected therefrom.

6. The method according to claim 1, wherein:

the belt-shaped second electrode has a width of at least 0.5 μm and at most 50 μm, and the ridge structure has a height of at least 0.1 μm and at most 10 μm.

7. The method according to claim 6, wherein:

the bi-section semiconductor laser device includes a first electrode electrically connected to the first compound semiconductor layer, and an electrical resistance between the first portion and the second portion of the belt-shaped second electrode is at least 10 times more than an electrical resistance between the belt-shaped second electrode and the first electrode.

8. The method according to claim 6, wherein an electrical resistance between the first portion and the second portion of the belt-shaped second electrode is at least $1 \times 10^2 \Omega$.

9. The method according to claim 6, wherein the width of the separating groove that separates the belt-shaped second electrode into the first portion and the second portion is at least 1 μm and at most 50% of a cavity length of the semiconductor laser.

* * * * *